US009412845B2

(12) United States Patent
Wu et al.

(10) Patent No.: US 9,412,845 B2
(45) Date of Patent: Aug. 9, 2016

(54) DUAL GATE STRUCTURE

(71) Applicant: SANDISK 3D LLC, Milpitas, CA (US)

(72) Inventors: Wei-Te Wu, Cupertino, CA (US); Ming-Che Wu, San Jose, CA (US); Yung-Tin Chen, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/519,068

(22) Filed: Oct. 20, 2014

(65) Prior Publication Data

US 2016/0111517 A1 Apr. 21, 2016

(51) Int. Cl.

| | |
|---|---|
| ***H01L 29/66*** | (2006.01) |
| ***H01L 29/786*** | (2006.01) |
| ***H01L 21/311*** | (2006.01) |
| ***H01L 21/02*** | (2006.01) |
| ***H01L 29/49*** | (2006.01) |
| ***H01L 29/51*** | (2006.01) |
| ***H01L 27/115*** | (2006.01) |
| ***H01L 21/8238*** | (2006.01) |

(52) U.S. Cl.

CPC ...... *H01L 29/6675* (2013.01); *H01L 21/02532* (2013.01); *H01L 21/02595* (2013.01); *H01L 21/31111* (2013.01); *H01L 21/823885* (2013.01); *H01L 27/11526* (2013.01); *H01L 27/11573* (2013.01); *H01L 29/4908* (2013.01); *H01L 29/4916* (2013.01); *H01L 29/4966* (2013.01); *H01L 29/51* (2013.01); *H01L 29/66484* (2013.01); *H01L 29/66666* (2013.01); *H01L 29/78648* (2013.01)

(58) Field of Classification Search

CPC .................... H01L 29/6675; H01L 21/02595; H01L 29/66666; H01L 29/51; H01L 21/823885; H01L 29/78648; H01L 29/66484; H01L 21/31111; H01L 29/4966; H01L 27/11573; H01L 29/4908; H01L 27/11526; H01L 21/02532

See application file for complete search history.

(56) References Cited

PUBLICATIONS

Yan, et al., U.S. Appl. No. 14/340,454, filed Jul. 24, 2014.

*Primary Examiner* — John P Dulka
(74) *Attorney, Agent, or Firm* — Vierra Magen Marcus LLP

(57) ABSTRACT

Methods for forming a dual gate structure for a vertical TFT are described. The dual gate structure may be formed by performing a first etching process that includes forming a first set of trenches by etching a first set of oxide pillars to a first depth and forming a second set of trenches by etching a second set of oxide pillars to a second depth higher than the first depth, forming a first set of gate structures within the first set of trenches, forming a second set of gate structures within the second set of trenches, performing a second etching process that includes forming a third set of trenches by etching the first set of gate structures from a second initial depth to a third depth and forming a fourth set of trenches by etching the second set of gate structures to a fourth depth higher than the third depth.

20 Claims, 26 Drawing Sheets

Programming

Reading

X
Z
Memory Layer
Pillar Select Layer
Metal Layers
CMOS
532
534
536
530a unsel
530b unsel
530c sel
530d unsel
530e unsel
n+
p-
2002
2010 L
2012 L
2014 H
2016 H
2018 L
2020 L
2000
2001
2030
2032
2034
2036
2038
2040
505
540
n+ poly
ML-2
ML1
ML0
GBL
CMOS

DUAL GATE STRUCTURE

BACKGROUND

1. Field of the Invention

The present invention relates to semiconductor technology.

2. Description of the Related Art

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. Since these voltages are necessarily also applied to a large number of other unselected memory elements because they are connected along the same conductors as the selected memory elements being programmed or read, diodes are commonly connected in series with the variable resistive elements in order to reduce leakage currents that can flow through them. The desire to perform data reading and programming operations with a large number of memory elements in parallel results in reading or programming voltages being applied to a very large number of other memory elements.

DETAILED DESCRIPTION

Figure 1:
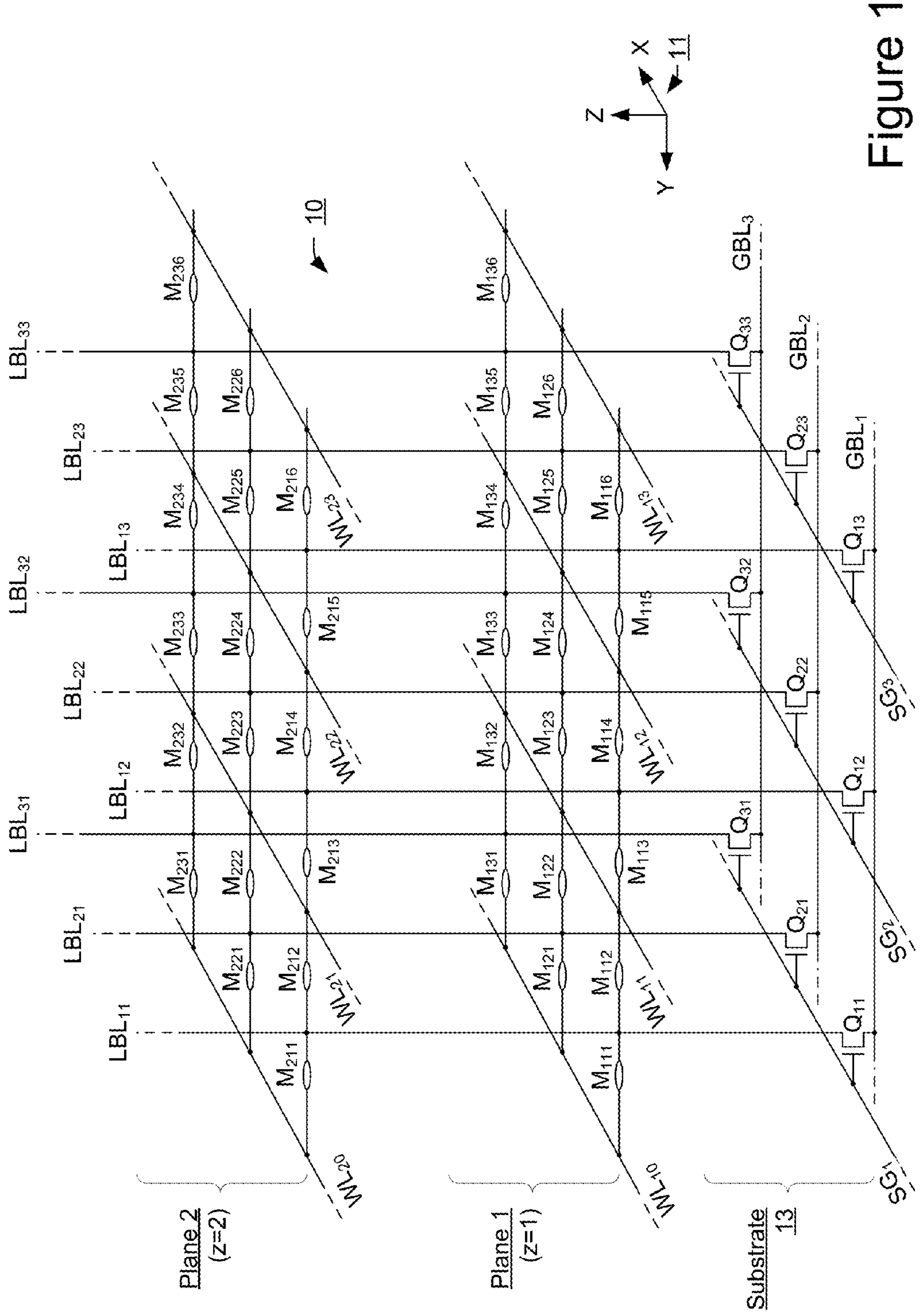
FIG. 1 is an equivalent circuit of a portion of an example three-dimensional array of variable resistance memory elements, wherein the array has vertical bit lines.

Technology is described for forming a dual gate structure for a vertical thin-film transistor (TFT). The dual gate structure may comprise a first gate and a second gate that must both be selected in order for the vertical TFT to be placed into a conducting state (e.g., to turn-on the vertical TFT to allow current to flow from a drain of the vertical TFT to a source of the vertical TFT). The first gate and the second gate may be staggered vertically (e.g., positioned in different horizontal planes above a substrate). The first gate may be arranged in a first horizontal plane and the second gate may be arranged in a second horizontal plane that is located above the first horizontal plane. The first gate may be arranged on a first side of a transistor channel of the vertical TFT and the second gate may be arranged on a second side of the transistor channel of the vertical TFT different from the first side. In some embodiments, a vertical TFT may be used to selectively connect a global bit line to a local bit line within a memory array (e.g., in order to allow charge to transfer between the global bit line and the local bit line). The vertical TFT may comprise a field-effect transistor that is formed by depositing one or more thin film layers and one or more dielectric layers over a substrate (e.g., a silicon or glass substrate). The one or more thin film layers may include a layer of polycrystalline silicon (or polysilicon or poly). The vertical TFT may be oriented such that a transistor channel and/or a gate of the vertical TFT is oriented in a vertical direction that is orthogonal to the substrate. In some embodiments, the dual gate structure may be formed by depositing one or more layers of polysilicon (e.g., forming an alternating layer stack of n-type and p-type polysilicon such as an NPNPN layer stack or an n+p−n+p−n+ layer stack), forming a plurality of oxide pillars within the one or more layers of polysilicon, performing a first etching process that includes etching a first set of oxide pillars of the plurality of oxide pillars to a first initial depth, performing a second etching process that includes forming a first set of trenches by etching the first set of oxide pillars from the first initial depth to a first depth and that includes forming a second set of trenches by etching a second set of oxide pillars of the plurality of oxide pillars to a second depth higher than the first depth (or to a second depth that is farther away from a substrate than the first depth), forming a plurality of gate dielectrics within the first set of trenches and the second set of trenches, forming a first set of gate structures within the first set of trenches, forming a second set of gate structures within the second set of trenches, performing a third etching process that includes etching the first set of gate structures to a second initial depth, performing a fourth etching process that includes forming a third set of trenches by etching the first set of gate structures from the second initial depth to a third depth and that includes forming a fourth set of trenches by etching the second set of gate structures to a fourth depth higher than the third depth, and filling the third set of trenches and the fourth set of trenches with an insulating material. The one or more layers of polysilicon may be formed using poly deposition techniques and/or ion implantation in order to form layers of n-type and p-type polysilicon. The first set of gate structures may be formed using a gate material, such as polysilicon or titanium nitride (TiN). The first set of gate structures may comprise a metal gate electrode. The insulating material may comprise an oxide or silicon dioxide. In one embodiment, a vertical TFT including a dual gate structure may be used for controlling vertical bit lines in a memory array (e.g., a vertical NAND memory array or a three-dimensional memory array). More information regarding vertical bit line memory arrays may be found in U.S. patent application Ser. No. 14/340,454, entitled "Shared-Gate Vertical-TFT for Vertical Bit Line Array," filed Jul. 24, 2014.

The benefits of using a dual gate structure for a vertical TFT include improved scaling, reduced vertical bit line spacing, increased gate thickness, and reduced gate electrode resistance.

In some embodiments, the dual gate structure may be formed using a first oxide recess followed by a second oxide recess in order to establish two different height levels for forming the dual gate structure. The first oxide recess and the second oxide recess may be performed using timed etches.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P–N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

Referring initially to FIG. 1, an architecture of one example embodiment of a three-dimensional memory 10 is schematically and generally illustrated in the form of an equivalent circuit of a portion of such a memory. A standard three-dimensional rectangular coordinate system 11 is used for reference, the directions of each of vectors x, y and z being orthogonal with the other two. In another embodiment direction x and x are substantially 60 degrees from each other.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the select devices to which it is connected. The remaining row select lines receive voltages that keep their connected select devices $Q_{xy}$ off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above the substrate 13. Two planes 1 and 2 are illustrated in FIG. 1 but there will typically be more, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_y$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 10, are examples of monolithic three dimensional memory structures. A monolithic three dimensional memory structure is one in which multiple memory levels are formed above (and not in) a single substrate, such as a wafer, with no intervening substrates and active areas of the memory are disposed above the substrate. The layers forming one memory level are deposited or grown directly over the layers of an existing level or levels. In contrast, stacked memories have been constructed by forming memory levels on separate substrates and adhering the memory levels atop each other. The substrates may be thinned or removed from the memory levels before bonding, but as the memory levels are initially formed over separate substrates, such memories are not true monolithic three dimensional memory structures or monolithic three dimensional memory arrays.

Figure 2:
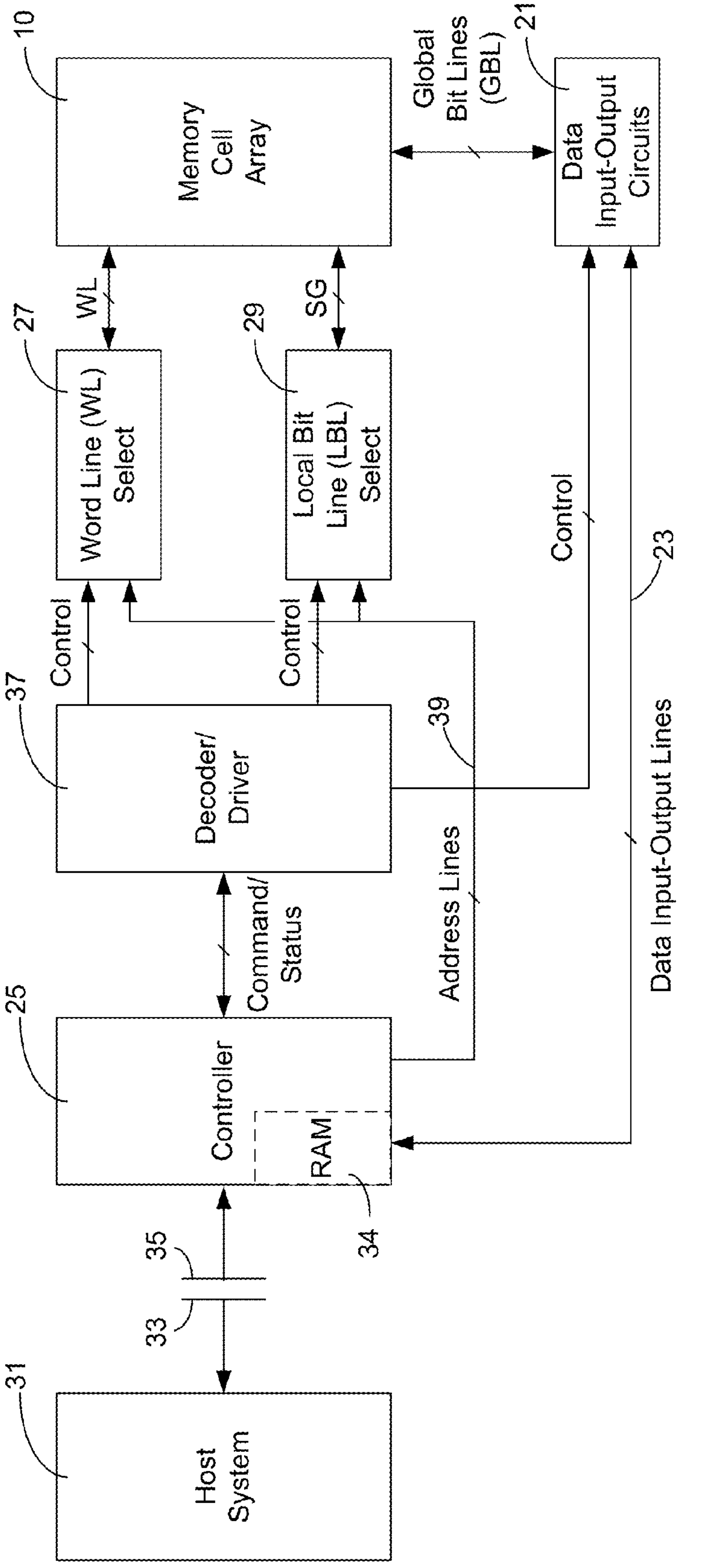
FIG. 2 is a schematic block diagram of a re-programmable non-volatile memory system which utilizes the memory array of FIG. 1, and which indicates connection of the memory system with a host system.

FIG. 2 is a block diagram of an illustrative memory system that can use the three-dimensional memory 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory elements $M_{zxy}$. Data input-output circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the input-output circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

Controller 25 conveys to decoder/driver circuits 37 commands received from the host 31. Similarly, status signals generated by the memory system are communicated to the controller 25 from decoder/driver circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and data input-output circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the local bit line select circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array. In one embodiment, any one or combination of Controller 25, decoder/driver circuits 37, circuits 21, 27 and 29, or other control logic can be referred to as one or more control circuits.

Although the memory system of FIG. 2 utilizes the three-dimensional memory array 10 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments. In some arrays the number of memory elements programmed in one operation may be less than the total number of memory elements connected to the selected word line to minimize IR drops, to minimize power, or for other reasons.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usually preferred to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory arrays. Resetting a block of memory elements to a common state corresponds to erasing a block of flash memory elements to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

Figure 3:
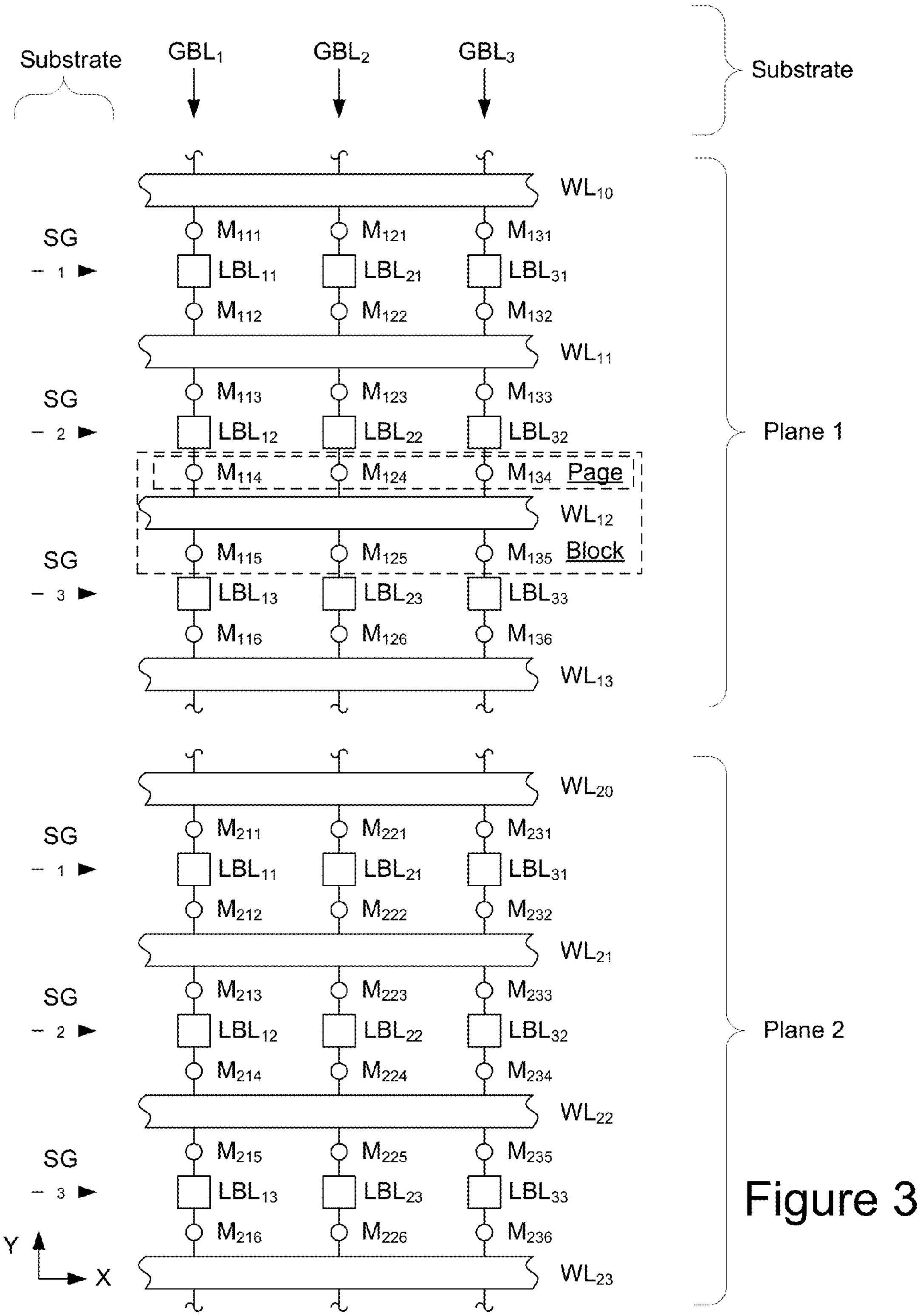
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of the array of FIG. 1. The different word lines $WL_{zy}$ that extend across each of the planes and the local bit lines $LBL_{xy}$ that extend through the planes are shown in two-dimensions. Individual blocks are made up of memory elements connected to both sides of one word line, or one segment of a word line if the word lines are segmented, in a single one of the planes. There are therefore a very large number of such blocks in each plane of the array. In the block illustrated in FIG. 3, each of the memory elements $M_{114}$, $M_{124}$, $M_{134}$, $M_{115}$, $M_{125}$ and $M_{135}$ connected to both sides of one word line $WL_{12}$ form the block. Of course, there will be many more memory elements connected along the length of a word line but only a few of them are illustrated, for simplicity. The memory elements of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory elements along one side of the word line of the block and the other page by the memory elements along the opposite side of the word line. The example page marked in FIG. 3 is formed by memory elements $M_{114}$, $M_{124}$ and $M_{134}$. Of course, a page will typically have a very large number of memory elements in order to be able to program and read a large amount of data at one time. Only a few of the storage elements of the page of FIG. 3 are included, for simplicity in explanation.

Example resetting, programming and reading operations of the memory array of FIGS. 1 and 3, when operated as array 10 in the memory system of FIG. 2, will now be described. For these examples, each of the memory elements $M_{zxy}$ is taken to include a non-volatile memory material that can be switched between two stable states of different resistance levels by impressing voltages (or currents) of different polarity across the memory element, or voltages of the same polarity but different magnitudes and/or duration. For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory elements that indicate storage of one bit of data, which is either a "0" or a "1," depending upon the memory element state.

To reset (e.g., erase) a block of memory elements, the memory elements in that block are placed into their high resistance state. This state will be designated as the logical data state "1," following the convention used in current flash memory arrays but it could alternatively be designated to be a "0." As shown by the example in FIG. 3, a block includes all the memory elements that are electrically connected to one word line WL or segment thereof. A block is the smallest unit of memory elements in the array that are reset together. It can include thousands of memory elements. If a row of memory elements on one side of a word line includes 1000 of them, for example, a block will have 2000 memory elements from the two rows on either side of the word line.

The following steps may be taken to reset all the memory elements of a block, using the block illustrated in FIG. 3 as an example:

1. Set all of the global bit lines ($GBL_1$, $GBL_2$ and $GBL_3$ in the array of FIGS. 1 and 3) to zero volts, by the circuits 21 of FIG. 2.

2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn on the select devices $Q_{xy}$, for example, something in a range of 1-6 volts, typically 3 volts. The block shown in FIG. 3 includes the word line $WL_{12}$, so the row select lines $SG_2$ and $SG_3$ (FIG. 1) on either side of that word line are set to H' volts, by the circuits 29 of FIG. 2, in order to turn on the select devices $Q_{12}$, $Q_{22}$, $Q_{32}$, $Q_{13}$, $Q_{23}$ and $Q_{33}$. This causes each of the local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.

3. Set the word line of the block being reset to H volts. This reset voltage value is dependent on the switching material in the memory element and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, while all other word lines in the array are placed at zero volts, all by the circuits 27 of FIG. 2.

The result is that H volts are placed across each of the memory elements of the block. In the example block of FIG. 3, this includes the memory elements $M_{114}$, $M_{124}$, $M_{134}$, $M_{115}$, $M_{125}$ and $M_{135}$. For the type of memory material being used as an example, the resulting currents through these memory elements places any of them not already in a high resistance state, into that re-set state.

It may be noted that no stray currents will flow because only one word line has a non-zero voltage. The voltage on the one word line of the block can cause current to flow to ground only through the memory elements of the block. There is also nothing that can drive any of the unselected and electrically floating local bit lines to H volts, so no voltage difference will exist across any other memory elements of the array outside of the block. Therefore no voltages are applied across unselected memory elements in other blocks that can cause them to be inadvertently disturbed or reset.

It may also be noted that multiple blocks may be concurrently reset by setting any combination of word lines and the adjacent select gates to H or H' respectively. In this case, the only penalty for doing so is an increase in the amount of current that is required to simultaneously reset an increased number of memory elements. This affects the size of the power supply that is required. In some embodiments, less than all memory elements of a block will be simultaneously reset.

The memory elements of a page are preferably programmed concurrently, in order to increase the parallelism of the memory system operation. An expanded version of the page indicated in FIG. 3 is provided in FIG. 4, with annotations added to illustrate a programming operation. The individual memory elements of the page are initially in their reset state because all the memory elements of its block have previously been reset. The reset state is taken herein to represent a logical data "1." For any of these memory elements to store a logical data "0" in accordance with incoming data being programmed into the page, those memory elements are switched into their low resistance state, their set state, while the remaining memory elements of the page remain in the reset state.

For programming a page, only one row of select devices is turned on, resulting in only one row of local bit lines being connected to the global bit lines. This connection alternatively allows the memory elements of both pages of the block to be programmed in two sequential programming cycles, which then makes the number of memory elements in the reset and programming units equal.

Figure 4:
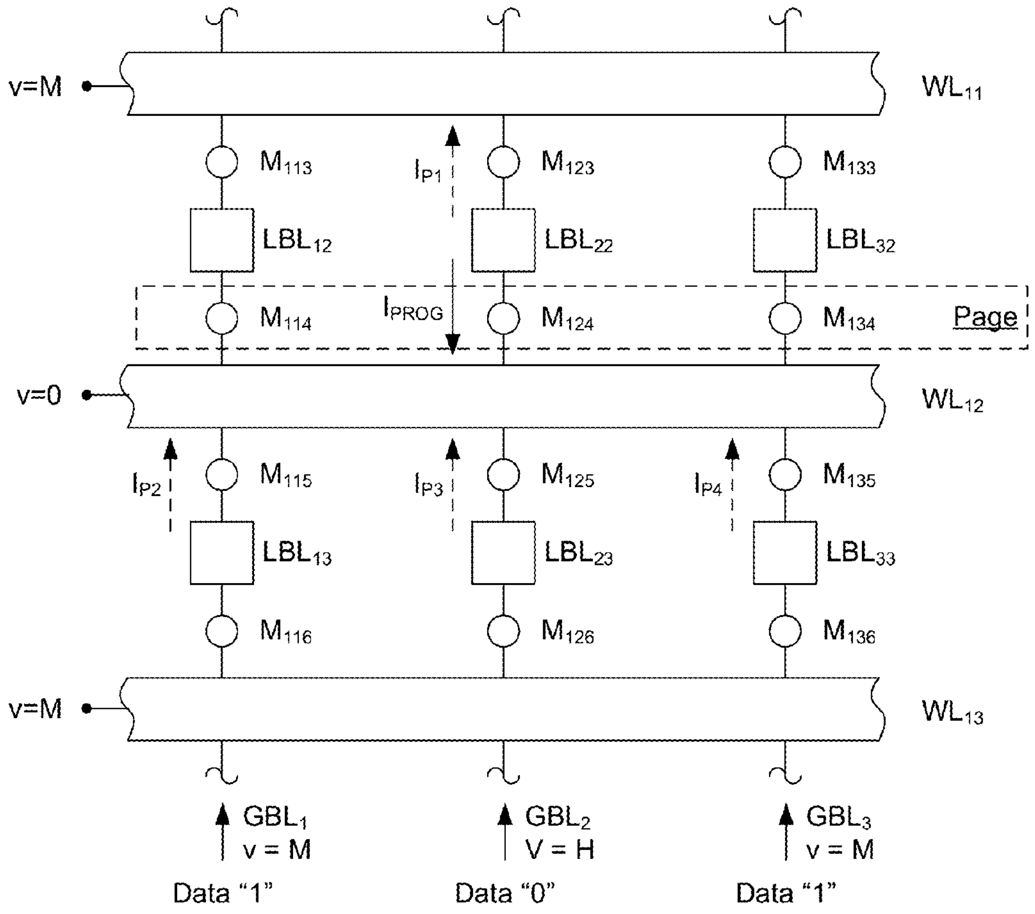
FIG. 4 is an expanded view of a portion of one of the planes of FIG. 3, annotated to show effects of programming data therein.

Referring to FIGS. 3 and 4, an example programming operation within the indicated one page of memory elements $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1", $GBL_2$ the logical bit "0" and $GBL_3$ the logical bit "1." The bit lines are set respectively to corresponding voltages M, H and M, as shown, where the M level voltage is high but not sufficient to program a memory element and the H level is high enough to force a memory element into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory elements $M_{114}$ and $M_{134}$ are to remain in their reset state, while memory element $M_{124}$ is being programmed. Therefore, the programming voltages are applied only to memory element $M_{124}$ of this page by the following steps.

2. Set the word line of the page being programmed to 0 volts, in this case selected word line $WL_{12}$. This is the only word line to which the memory elements of the page are connected. Each of the other word lines on all planes is set to the M level. These word line voltages are applied by the circuits 27 of FIG. 2.

3. Set one of the row select lines below and on either side of the selected word line to the H' voltage level, in order to select a page for programming. For the page indicated in FIGS. 3 and 4, the H' voltage is placed on row select line $SG_2$ in order to turn on select devices $Q_{12}$, $Q_{22}$ and $Q_{32}$ (FIG. 1). All other row select lines, namely lines $SG_1$ and $SG_3$ in this example, are set to 0 volts in order to keep their select devices off. The row select line voltages are applied by the circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned on, while all other local bit lines (LBLs) of the array are left floating.

The result of this operation, for the example memory element material mentioned above, is that a programming current $I_{PROG}$ is sent through the memory element $M_{124}$, thereby causing that memory element to change from a reset state to a set (programmed) state. The same will occur with other memory elements (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of the circuits 27 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory elements in their low resistance state (programmed) that are connected between the floating local bit lines and adjacent word lines. These outer word lines of the selected plane and word lines in unselected planes, although allowed to float, may eventually be driven up to voltage level M through a combination of programmed memory elements.

There are typically parasitic currents present during the programming operation that can increase the currents that must be supplied through the selected word line and global bit lines. During programming there are two sources of parasitic currents, one to the adjacent page in a different block and another to the adjacent page in the same block. An example of the first is the parasitic current $I_{P1}$ shown on FIG. 4 from the local bit line $LBL_{22}$ that has been raised to the voltage level H during programming. The memory element $M_{123}$ is connected between that voltage and the voltage level M on its word line $WL_{11}$. This voltage difference can cause the parasitic current $-I_{P1}$ to flow. Since there is no such voltage difference between the local bit lines $LBL_{12}$ or $LBL_{32}$ and the word line $WL_{11}$, no such parasitic current flows through either of the memory elements $M_{113}$ or $M_{133}$, a result of these memory elements remaining in the reset state according to the data being programmed.

Other parasitic currents can similarly flow from the same local bit line $LBL_{22}$ to an adjacent word line in other planes. The presence of these currents may limit the number of planes that can be included in the memory system since the total current may increase with the number of planes. The limitation for programming is in the current capacity of the memory power supply, so the maximum number of planes is a tradeoff between the size of the power supply and the number of planes. A number of 4-16 planes may generally be used in most cases, but a different amount can also be used.

The other source of parasitic currents during programming is to an adjacent page in the same block. The local bit lines that are left floating (all but those connected to the row of memory elements being programmed) will tend to be driven to the voltage level M of unselected word lines through any programmed memory element on any plane. This in turn can cause parasitic currents to flow in the selected plane from these local bit lines at the M voltage level to the selected word line that is at zero volts. An example of this is given by the currents $I_{P2}$, $I_{P3}$ and $I_{P4}$ shown in FIG. 4. In general, these currents will be much less than the other parasitic current $I_{p1}$ discussed above, since these currents flow only through those memory elements in their conductive state that are adjacent to the selected word line in the selected plane.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating because the parasitic currents flowing to them are so low as to be negligible compared to the identified parasitic currents since they must flow through a series combination of five or more ON devices (devices in their low resistance state). This can reduce the power dissipation caused by charging a large number of word lines.

While the above description assumes that each memory element of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory element has reached its desired programmed level of resistance or conductance consistent with the data being programmed in the memory element. The sequence of program/verify is terminated for each memory element as it is verified to reach the desired value of resistance or conductance. After all of memory elements being programmed are verified to have reached their desired programmed value, programming of the page of memory elements is then completed. An example of this technique is described in U.S. Pat. No. 5,172,338.

Figure 5:
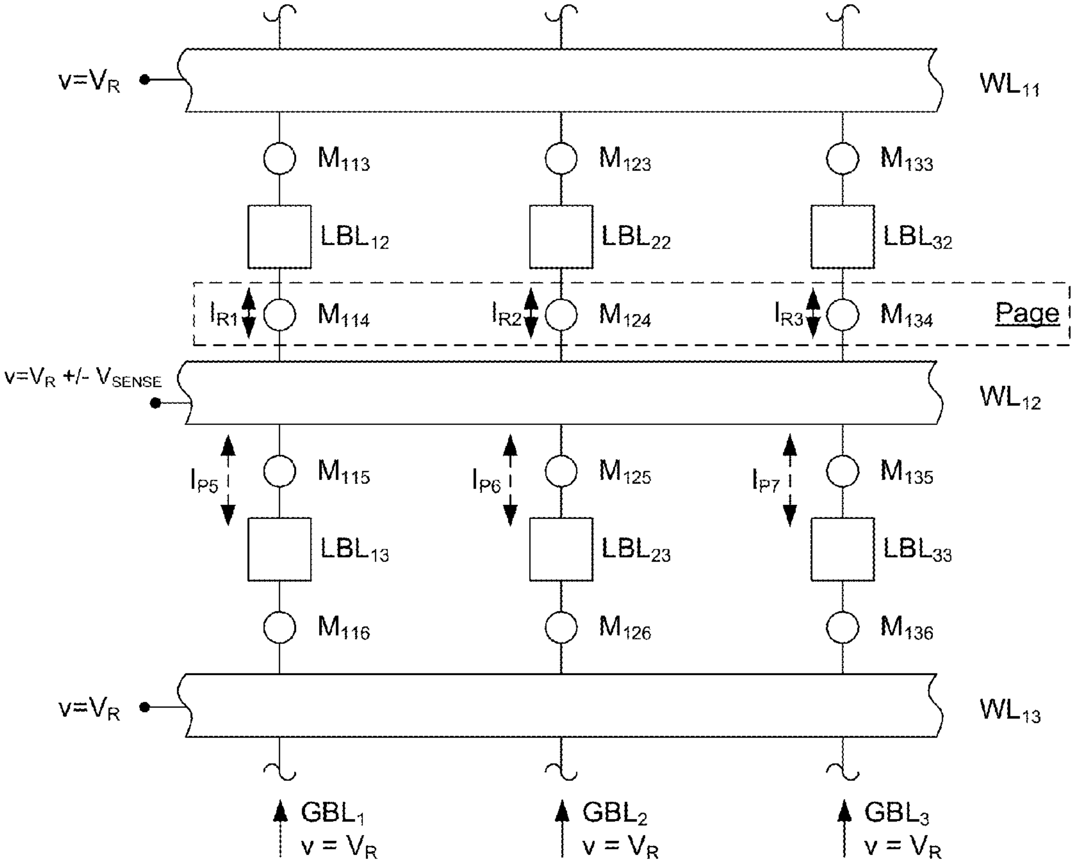
FIG. 5 is an expanded view of a portion of one of the planes of FIG. 3, annotated to show effects of reading data therefrom.

With reference primarily to FIG. 5, the parallel reading of the states of a page of memory elements, such as the memory elements $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$ in order to reduce parasitic read currents, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn on one row of select devices by placing a voltage on the control line adjacent to the selected word line in order to define the page to be read. In the example of FIGS. 1 and 5, a voltage is applied to the row select line $SG_2$ in order to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in the circuits 21 of FIG. 2, and assume the potential $V_R$ of the global bit lines to which they are connected. All other local bit lines LBLs are allowed to float.

3. Set the selected word line ($WL_{12}$) to a voltage of $V_R$±Vsense. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $I_{R1}$, $I_{R2}$ and $I_{R3}$ shown to be flowing through the addressed memory elements of the example of FIG. 5, which are proportional to the programmed states of the respective memory elements $M_{114}$, $M_{124}$ and $M_{134}$. The states of the memory elements $M_{114}$, $M_{124}$ and $M_{134}$ are then given by binary outputs of the sense amplifiers within the circuits 21 that are connected to the respective global bit lines $GBL_1$, $GBL_2$ and $GBL_3$. These sense amplifier outputs are then sent over the lines 23 (FIG. 2) to the controller 25, which then provides the read data to the host 31.

5. Turn off the select devices ($Q_{12}$, $Q_{22}$ and $Q_{32}$) by removing the voltage from the row select line ($SG_2$), in order to disconnect the local bit lines from the global bit lines, and return the selected word line ($WL_{12}$) to the voltage $V_R$.

Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory element that is in its programmed (low resistance) state and connected between a floating local bit line and a word line at $V_R$, in any plane. A parasitic current comparable to $I_{P1}$ in the programming case (FIG. 4) is not present during data read because both the selected local bit lines and the adjacent non-selected word lines are both at $V_R$. Parasitic currents may flow, however, through low resistance memory elements connected between floating local bit lines and the selected word line. These are comparable to the currents $I_{P2}$, $I_{P3}$, and $I_{P4}$ during programming (FIG. 4), indicated as $I_{P5}$, $I_{P6}$ and $I_{P7}$ in FIG. 5. Each of these currents can be equal in magnitude to the maximum read current through an addressed memory element. However, these parasitic currents are flowing from the word lines at the voltage $V_R$ to the selected word line at a voltage $V_R$±Vsense without flowing through the sense amplifiers. These parasitic currents will not flow through the selected local bit lines ($LBL_{12}$, $LBL_{22}$ and $LBL_{32}$ in FIG. 5) to which the sense amplifiers are connected. Although they contribute to power dissipation, these parasitic currents do not therefore introduce a sensing error.

Although the neighboring word lines should be at $V_R$ to minimize parasitic currents, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R$±Vsense but the sense amplifier current is not measured until this charging transient is completed.

Reference cells may also be included within the memory array 10 to facilitate any or all of the common data operations (erase, program, or read). A reference cell is a cell that is structurally as nearly identical to a data cell as possible in which the resistance is set to a particular value. They are useful to cancel or track resistance drift of data cells associated with temperature, process non-uniformities, repeated programming, time or other cell properties that may vary during operation of the memory. Typically they are set to have a resistance above the highest acceptable low resistance value of a memory element in one data state (such as the ON resistance) and below the lowest acceptable high resistance value of a memory element in another data state (such as the OFF resistance). Reference cells may be "global" to a plane or the entire array, or may be contained within each block or page.

In one embodiment, multiple reference cells may be contained within each page. The number of such cells may be only a few (less than 10), or may be up to a several percent of the total number of cells within each page. In this case, the reference cells are typically reset and written in a separate operation independent of the data within the page. For example, they may be set one time in the factory, or they may be set once or multiple times during operation of the memory array. During a reset operation described above, all of the global bit lines are set low, but this can be modified to only set the global bit lines associated with the memory elements being reset to a low value while the global bit lines associated with the reference cells are set to an intermediate value, thus inhibiting them from being reset. Alternately, to reset reference cells within a given block, the global bit lines associated with the reference cells are set to a low value while the global bit lines associated with the data cells are set to an intermediate value. During programming, this process is reversed and the global bit lines associated with the reference cells are raised to a high value to set the reference cells to a desired ON resistance while the memory elements remain in the reset state. Typically the programming voltages or times will be changed to program reference cells to a higher ON resistance than when programming memory elements.

If, for example, the number of reference cells in each page is chosen to be 1% of the number of data storage memory elements, then they may be physically arranged along each word line such that each reference cell is separated from its neighbor by 100 data cells, and the sense amplifier associated with reading the reference cell can share its reference information with the intervening sense amplifiers reading data. Reference cells can be used during programming to ensure the data is programmed with sufficient margin.

In a particular embodiment, reference cells may be used to approximately cancel parasitic currents in the array. In this case the value of the resistance of the reference cell(s) is set to that of the reset state rather than a value between the reset state and a data state as described earlier. The current in each reference cell can be measured by its associated sense amplifier and this current subtracted from neighboring data cells. In this case, the reference cell is approximating the parasitic currents flowing in a region of the memory array that tracks and is similar to the parasitic currents flowing in that region of the array during a data operation. This correction can be applied in a two step operation (measure the parasitic current in the reference cells and subsequently subtract its value from that obtained during a data operation) or simultaneously with the data operation. One way in which simultaneous operation is possible is to use the reference cell to adjust the timing or reference levels of the adjacent data sense amplifiers.

In conventional two-dimensional arrays of variable resistance memory elements, a diode is usually included in series with the memory element between the crossing bit and word lines. The primary purpose of the diodes is to reduce the number and magnitudes of parasitic currents during resetting (erasing), programming and reading the memory elements. A significant advantage of the three-dimensional array herein is that resulting parasitic currents are fewer and therefore have a reduced negative effect on operation of the array than in other types of arrays.

Diodes may also be connected in series with the individual memory elements of the three-dimensional array, as currently done in other arrays of variable resistive memory elements, in order to reduce further the number of parasitic currents but there are disadvantages in doing so. Primarily, the manufacturing process becomes more complicated. Added masks and added manufacturing steps are then necessary. Also, since formation of the silicon p–n diodes often requires at least one high temperature step, the word lines and local bit lines cannot then be made of metal having a low melting point, such as aluminum that is commonly used in integrated circuit manufacturing, because it may melt during the subsequent high temperature step. Use of a metal, or composite material including a metal, is preferred because of its higher conductivity than the conductively doped polysilicon material that is typically used for bit and word lines because of being exposed to such high temperatures.

Because of the reduced number of parasitic currents in the three-dimensional array herein, the total magnitude of parasitic currents can be managed without the use of such diodes. In addition to the simpler manufacturing processes, the absence of the diodes allows bi-polar operation; that is, an operation in which the voltage polarity to switch the memory element from its first state to its second memory state is opposite of the voltage polarity to switch the memory element from its second to its first memory state. The advantage of the bi-polar operation over a unipolar operation (same polarity voltage is used to switch the memory element from its first to second memory state as from its second to first memory state) is the reduction of power to switch the memory element and an improvement in the reliability of the memory element. These advantages of the bi-polar operation are seen in memory elements in which formation and destruction of a conductive filament is the physical mechanism for switching, as in the memory elements made from metal oxides and solid electrolyte materials. For these reasons, the embodiments discussed below utilize memory elements that include resistance switching material and do not include a diode or other separate steering device. The use of memory elements that have a non-linear current vs voltage relationship are also envisioned. For example as the voltage across a HfOx memory element is reduced from the programming voltage to one half the programming voltage the current is reduced by a factor of 5 or even more. In such an embodiment the total magnitude of parasitic currents can be managed without the use of diodes in the array.

The level of parasitic currents increases with the number of planes and with the number of memory elements connected along the individual word lines within each plane. The increase in parasitic currents increases only slightly with additional planes because the selected word line is on only one plane such as WL12 in FIG. 4. Parasitic currents Ip1, Ip2, Ip3, and Ip4 are all on the plane that contains WL12. Leakage currents on other planes are less significant because the floating lines tend to minimize currents on elements not directly connected to the selected word line. Also since the number of unselected word lines on each plane does not significantly affect the amount of parasitic current, the planes may individually include a large number of word lines. The parasitic currents resulting from a large number of memory elements connected along the length of individual word lines can further be managed by segmenting the word lines into sections of fewer numbers of memory elements. Erasing, programming and reading operations are then performed on the memory elements connected along one segment of each word line instead of the total number of memory elements connected along the entire length of the word line.

The re-programmable non-volatile memory array being described herein has many advantages. The quantity of digital data that may be stored per unit of semiconductor substrate area is high. It may be manufactured with a lower cost per stored bit of data. Only a few masks are necessary for the entire stack of planes, rather than requiring a separate set of masks for each plane. The number of local bit line connections with the substrate is significantly reduced over other multi-plane structures that do not use the vertical local bit lines. The architecture eliminates the need for each memory element to have a diode in series with the resistive memory element, thereby further simplifying the manufacturing process and enabling the use of metal conductive lines. Also, the voltages necessary to operate the array are much lower than those used in current commercial flash memories.

Since at least one-half of each current path is vertical, the voltage drops present in large cross-point arrays are significantly reduced. The reduced length of the current path due to the shorter vertical component means that there are approximately one-half the number memory elements on each current path and thus the leakage currents are reduced as is the number of unselected memory elements disturbed during a data programming or read operation. For example, if there are N cells associated with a word line and N cells associated with a bit line of equal length in a conventional array, there are 2 N cells associated or "touched" with every data operation. In the vertical local bit line architecture described herein, there are n cells associated with the bit line (n is the number of planes and is typically a small number such as 4 to 16), or N+n cells are associated with a data operation. For a large N this means that the number of cells affected by a data operation is approximately one-half as many as in a conventional three-dimensional array.

The material used for the non-volatile memory elements $M_{zxy}$ in the array of FIG. 1 can be a chalcogenide, a metal oxide (MeOx), CMO, or any one of a number of materials that exhibit a stable, reversible shift in resistance in response to an external voltage applied to or current passed through the material.

Metal oxides (MeOx) are characterized by being insulating when initially deposited. One suitable metal oxide is a titanium oxide ($TiO_x$) in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^{+}_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure, the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements $M_{zxy}$ in the array of FIG. 1 include HfOx, ZrOx, WOx, NiOx, CoOx, CoalOx, MnOx, $ZnMn_2O_4$, ZnOx, TaOx, NbOx, HfSiOx, HfAlOx. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich TiOx, TiAlN, TaAlN, TiSiN, TaSiN, $IrO_2$ and doped polysilicon. Suitable materials for the bottom electrode are any conducting oxygen rich material such as Ti(O)N, Ta(O)N, TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g, bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

It will be noted that the memory materials in some of the foregoing examples utilize electrodes on either side thereof whose compositions are specifically selected. In embodiments of the three-dimensional memory array herein where the word lines (WL) and/or local bit lines (LBL) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

Steering elements are commonly incorporated into controllable resistance types of memory storage elements. Steering elements can be a transistor or a diode. Although an advantage of the three-dimensional architecture described herein is that such steering elements are not necessary, there may be specific configurations where it is desirable to include steering elements. The diode can be a p–n junction (not necessarily of silicon), a metal/insulator/insulator/metal (MIIM), or a Schottky type metal/semiconductor contact but can alternately be a solid electrolyte element. A characteristic of this type of diode is that for correct operation in a memory array, it is necessary to be switched "on" and "off" during each address operation. Until the memory element is addressed, the diode is in the high resistance state ("off" state) and "shields" the resistive memory element from disturb voltages. To access a resistive memory element, three different operations are needed: a) convert the diode from high resistance to low resistance, b) program, read, or reset (erase) the memory element by application of appropriate voltages across or currents through the diode, and c) reset (erase) the diode. In some embodiments one or more of these operations can be combined into the same step. Resetting the diode may be accomplished by applying a reverse voltage to the memory element including a diode, which causes the diode filament to collapse and the diode to return to the high resistance state.

Figure 6:
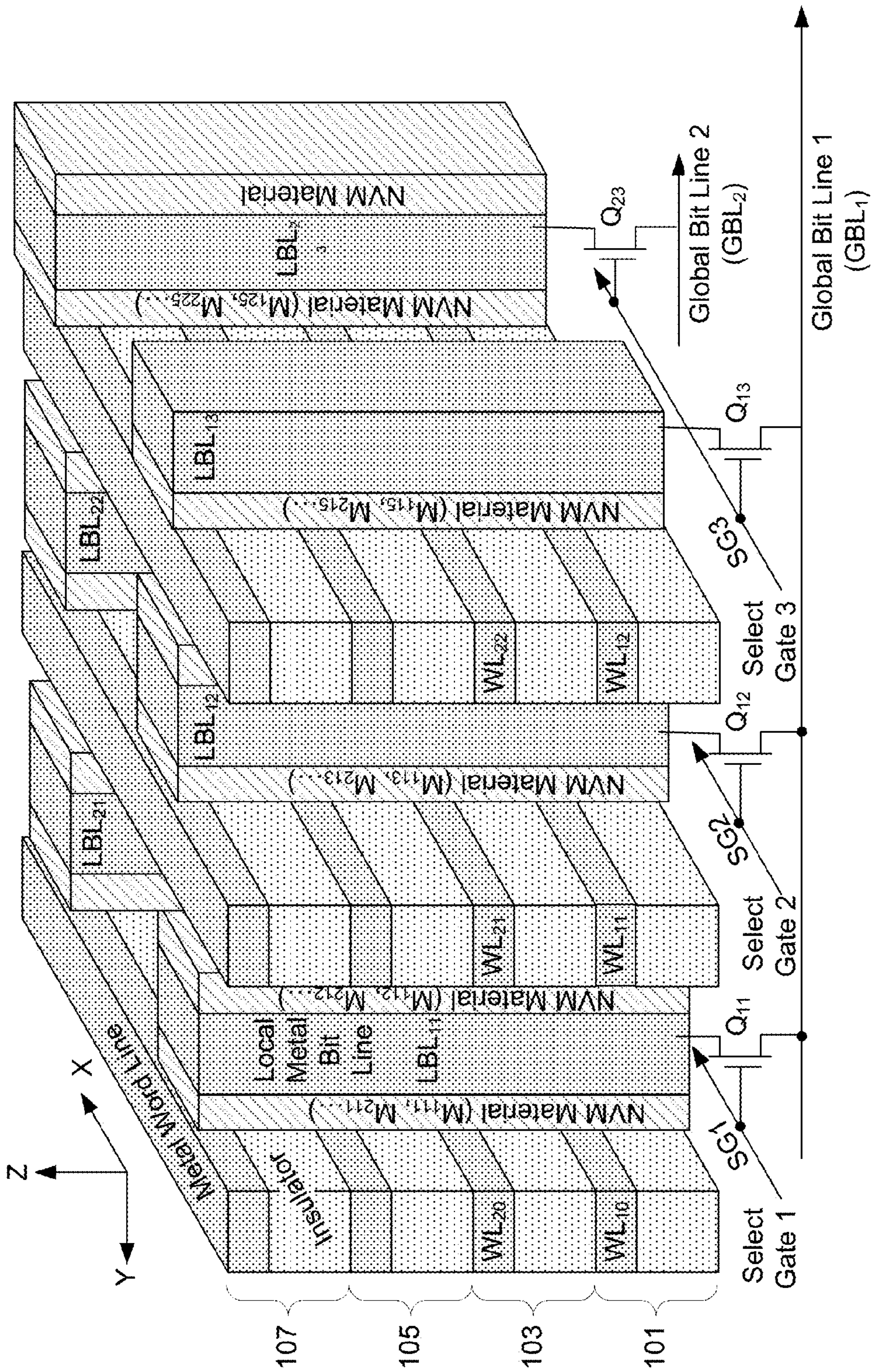
FIG. 6 is an isometric view of a portion of the three-dimensional array shown in FIG. 1 according to a first specific example of an implementation thereof.

One example semiconductor structure for implementing the three-dimensional memory element array of FIG. 1 is illustrated in FIG. 6, which is configured for use of non-volatile memory element (NVM) material that is non-conductive when first deposited. A metal oxide of the type discussed above has this characteristic. Since the material is initially non-conductive, there is no necessity to isolate the memory elements at the cross-points of the word and bit lines from each other. Several memory elements may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. It will be noted that FIG. 6 shows the two planes 1 and 2 of FIG. 1 plus two additional planes on top of them. All of the planes have the same horizontal pattern of conductor, dielectric and NVM material. In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry. In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines.

In one embodiment, the NVM material includes Hafnium Oxide, the word lines comprise TiN, and the bit lines comprise N+ silicon.

There may also be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 6, four such sheets are formed.
3. These sheets are then etched (isolated) by using a mask formed over the top of them that has slits elongated in the x-direction and spaced apart in the y-direction. All of the material is removed down to the etch stop in order to form the trenches shown in FIG. 6 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

To enable the memory to be denser (e.g., more memory elements per area), the size of the memory elements can be made smaller and the memory elements can be arranged closer to each other than in the past. To enable the memory elements to be closer to each other, one embodiment uses a vertically oriented select device (e.g., three terminal switch and/or select transistor) for connecting the individual local bit line pillars to the respective global bit lines. For example, the select devices $Q_{11}$, $Q_{12}$, . . . , $Q_{21}$, $Q_{22}$, . . . of FIG. 1 can be implemented as vertically oriented select devices. In one embodiment, each vertically oriented select device is a pillar select device that is formed as a vertical structure, switching between a local bit line pillar and a global bit line. The pillar select devices, unlike previous embodiments where they are formed within a CMOS layer, are in the present embodiments formed in a separate layer (pillar select layer) above the CMOS layer/substrate, along the z-direction between the array of global bit lines and the array of local bit lines. The CMOS layer is the substrate where the support circuitry is implemented, including the row select circuit and word line drivers. The use of vertically oriented select devices above, but not in, the substrate allows the memory elements to be arranged in a more compact fashion, thereby increasing density. Additionally, positioning the vertically oriented select devices above the substrate allows for other devices (e.g., the word line drivers) to be positioned in the substrate under the memory array rather than outside of the array, which allows the integrated circuit to be smaller.

For example, a pillar shaped Thin Film Transistor (TFT) FET or JFET can be can be used as the select device. In one example implementation, a control node of the select transistor has a collar shaped hole, and the gate and channel region are formed in the hole with the source/drain regions formed above/below the channel region. Another alternative is to define the gates as a rail etch and have the channel deposited in a trench between the gates and singulated by an etch with crossing lines mask (rather than holes).

Figure 7:
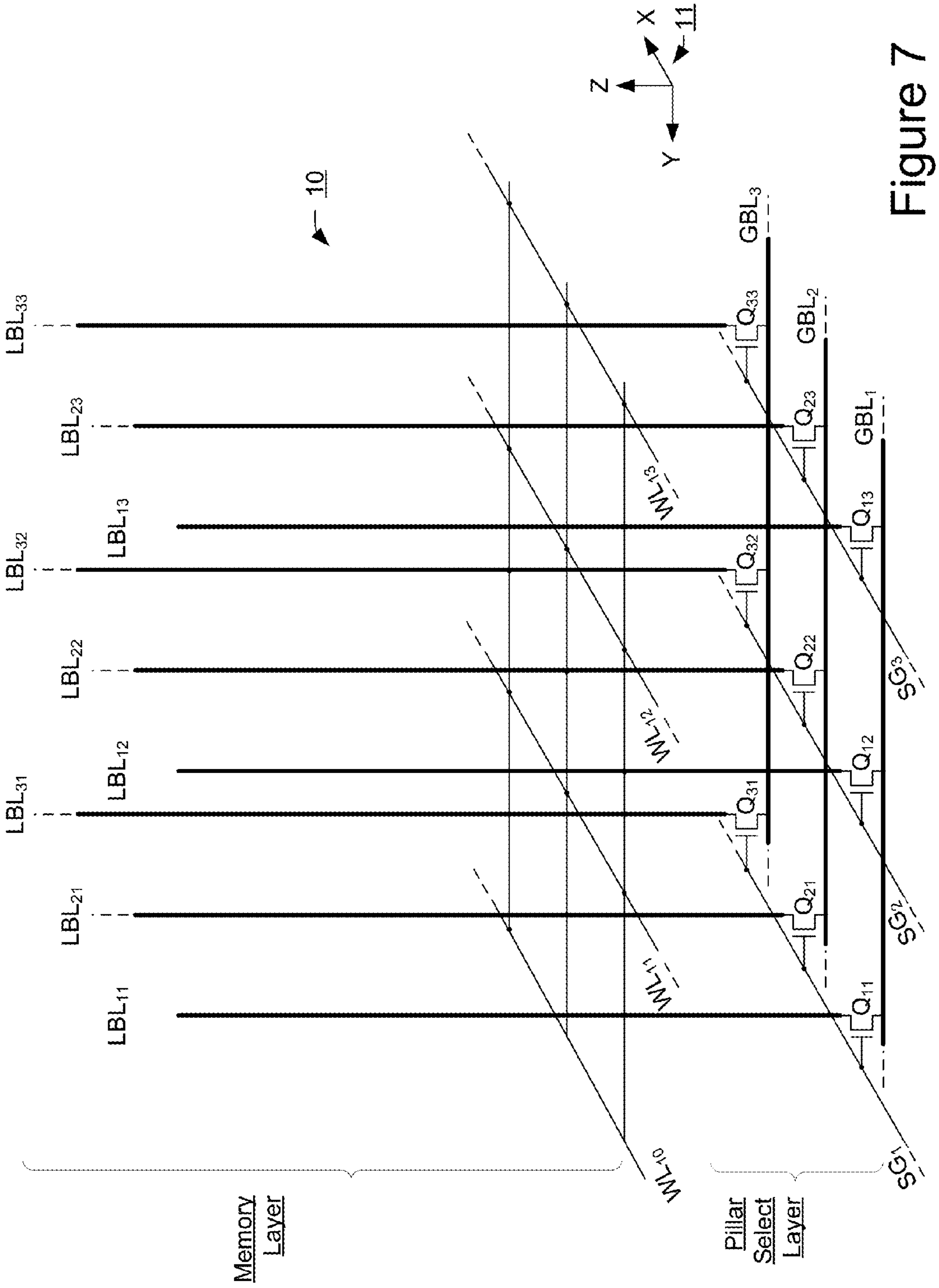
FIG. 7 is an equivalent circuit of a portion of an example three-dimensional array of variable resistance memory elements, wherein the array has vertical bit lines and a pillar select layer, both of which are above (and not in) the substrate.

FIG. 7 illustrates schematically the three dimensional memory ("3D memory") comprising of a memory layer on top of a pillar select layer. The 3D memory 10 is formed on top of a CMOS substrate (not shown explicitly) where structures in the CMOS are referred to as being in the FEOL ("Front End of Lines"). The vertically oriented select devices switching individual vertical bit lines (that are above and not in the substrate) to individual global bit lines are now formed on top of the FEOL layer in the BEOL ("Back End of Lines"). Thus, the BEOL comprises of the pillar select layer with the memory layer on top of it. The vertically oriented select devices (such as $Q_{11}$, $Q_{12}$, . . . , $Q_{21}$, $Q_{22}$, . . . , etc) are formed in the pillar select layer as vertically oriented select devices. The pillar select layer is formed above (and not in) the substrate. The memory layer is similar to that described above, comprising of multiple layers of word lines and memory elements. For simplicity, FIG. 7 shows only one layer of word lines, such as $WL_{10}$, $W_{11}$, . . . , etc. without showing the memory elements that exist between each crossing of a word line and a bit line.

Figure 8A:
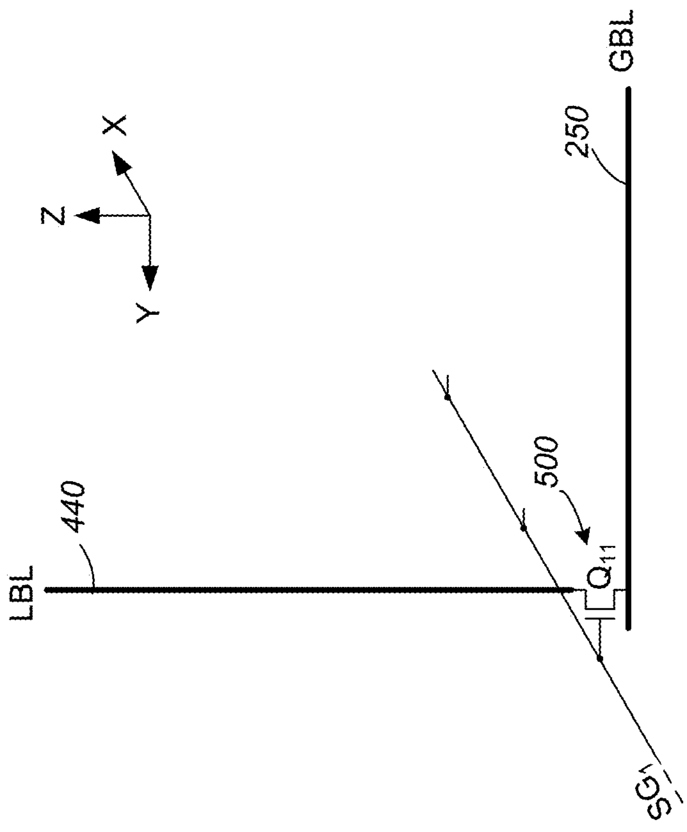
FIG. 8A is a schematic that depicts a vertical bit line, a vertically oriented select device and a global bit line.

FIG. 8A illustrates a schematic circuit diagram of a given vertically oriented select device switching a local bit line to a global bit line. In the example, the local bit line LBL 440 is switchable to the global bit line GBL 250 by a vertically oriented select transistor 500 such as $Q_{11}$. The gate of the select transistor $Q_{11}$ is controllable by a signal exerted on a row select line $SG_1$.

Figure 8B:
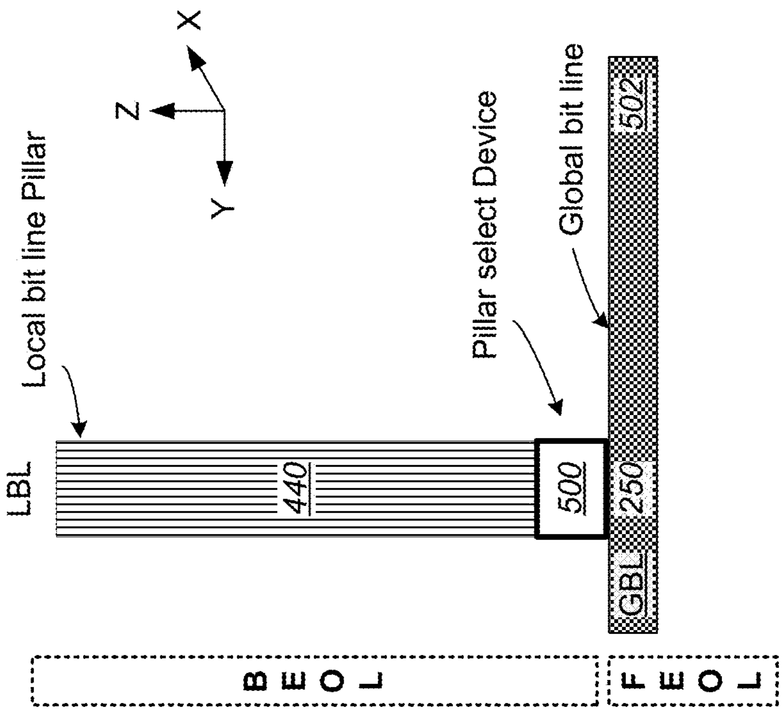
FIG. 8B is a plan view that depicts a vertical bit line, a vertically oriented select device and a global bit line.

FIG. 8B illustrates the structure of the vertically oriented select device in relation to the local bit line and the global bit line. The global bit line such as GBL 250 is formed below the vertically oriented select device, in the FEOL as part of the metal layer-1 or metal layer-2 502. The vertically oriented select device in the form of the vertical active TFT transistor 500 (e.g., vertically oriented channel MOS TFT or vertically oriented channel JFET) is formed in the BEOL layer on top of the GBL 250 (and above, but not in, the substrate). The local bit line LBL 440, in the form of a pillar, is formed on top of the vertically oriented select device 500. In this way, the vertically oriented select device 500 can switch the local bit line pillar LBL to the global bit line GBL.

Figure 9:
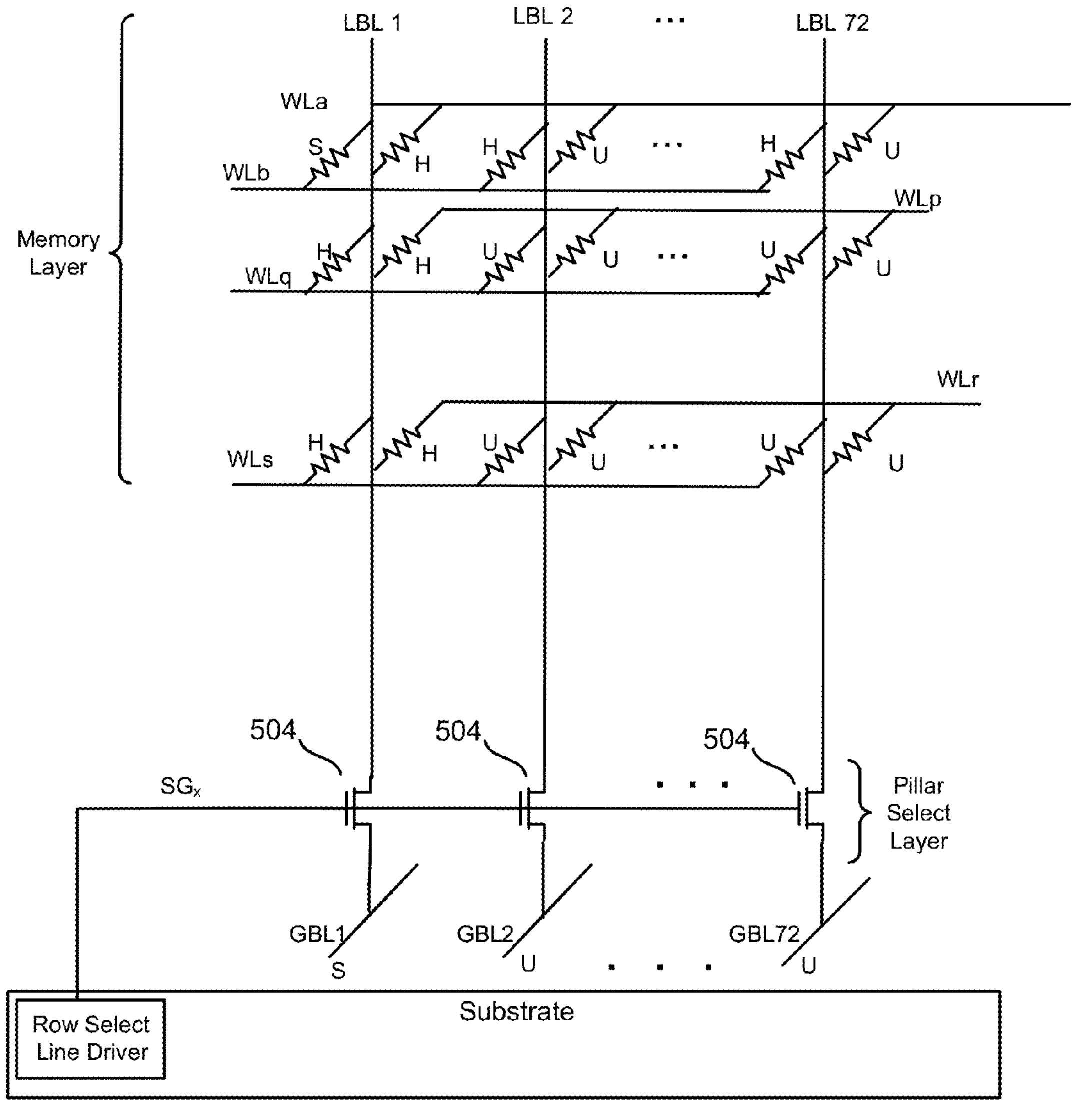
FIG. 9 is a schematic of a portion of the memory system, depicting vertical bit lines above the substrate, vertically oriented select devices above the substrate and row select line drivers in the substrate.

FIG. 9 shows a portion of the memory system, with the memory elements being depicted as resistors (due to their reversible resistance switching properties). FIG. 9 shows the Pillar Select Layer below the Memory Layer and above (and not in) the Substrate. Only a portion of the Memory Layer is illustrated. For example, FIG. 9 shows bit lines LBL1, LBL2, . . . LBL72. In this embodiment each of the word lines are connected to 72 memory elements. Each of the memory elements is connected between a word line and a bit line. Therefore, there will be 72 memory elements connected to the same word line and different bit lines (of the 72 bit lines in a row). Each of the bit lines are connected to a respective global bit line by one of the vertically oriented select devices 504 of the Pillar Select Layer. The signal $SG_x$ driving the set of vertically oriented select devices 504 depicted in FIG. 9 is controlled by the Row Select Line Driver. Note that the Row Select Line Driver is implemented in the substrate. The global bit lines (GBL1, GBL2, . . . GBL72) are implemented in the metal lines above the substrate. FIG. 9 shows one slice taken along the word line direction such that each of the bit lines depicted in FIG. 9 are connected to different global bit lines via the vertically oriented select devices 504.

In one embodiment, pairs of neighboring word lines (e.g., WLa and WLb, WLp and WLq, WLr and WLs) will be connected to memory elements that are in turn connected to common bit lines. FIG. 9 shows three pairs of word lines (WLa and WLb, WLp and WLq, WLr and WLs), with each of the pair being on a different layer of the memory structure. In one illustrative embodiment, the word lines receive address dependent signals such a that word line WLb is selected for memory operation while word lines WLa, WLp, WLq, WLr and WLs are not selected. Although the enabling signal applied on row select line $SG_x$ causes all of the vertically oriented select devices 504 to connect the respective global bit lines to the respective local bit lines of FIG. 9, only the global bit line GLBL1 includes a data value for programming (as noted by the S). Global bit lines GLBL2 and GLBL72 do not include data for programming (as noted by the U). This can be due to the data pattern being stored as the global bit lines receive data dependent signals. Note that while SGx receive an enable signal, other select lines receive a disable signal to turn off the connected select devices.

Because local bit line LBL 1 and word line WLb are both selected for programming, the memory element between local bit line LBL1 and word line WLb is selected for the memory operation (as noted by the S). Since local bit line LBL1 is the only bit line with program data, the other memory elements connected to WLb will be half selected (as noted by H). By half selected, it is meant that one of the control lines (either the bit line or the word line) is selected but the other control line is not selected. A half selected memory element will not undergo the memory operation. The word line WLa is not selected; therefore, the memory cell between WLa and local bit line LBL1 is half selected, and the other memory elements on WLa are unselected. Since word lines WLp, WLq, WLr and WLs are not selected, their memory elements connected to LBL1 are half selected and the other memory elements connected to those word lines are unselected.

Figure 10:
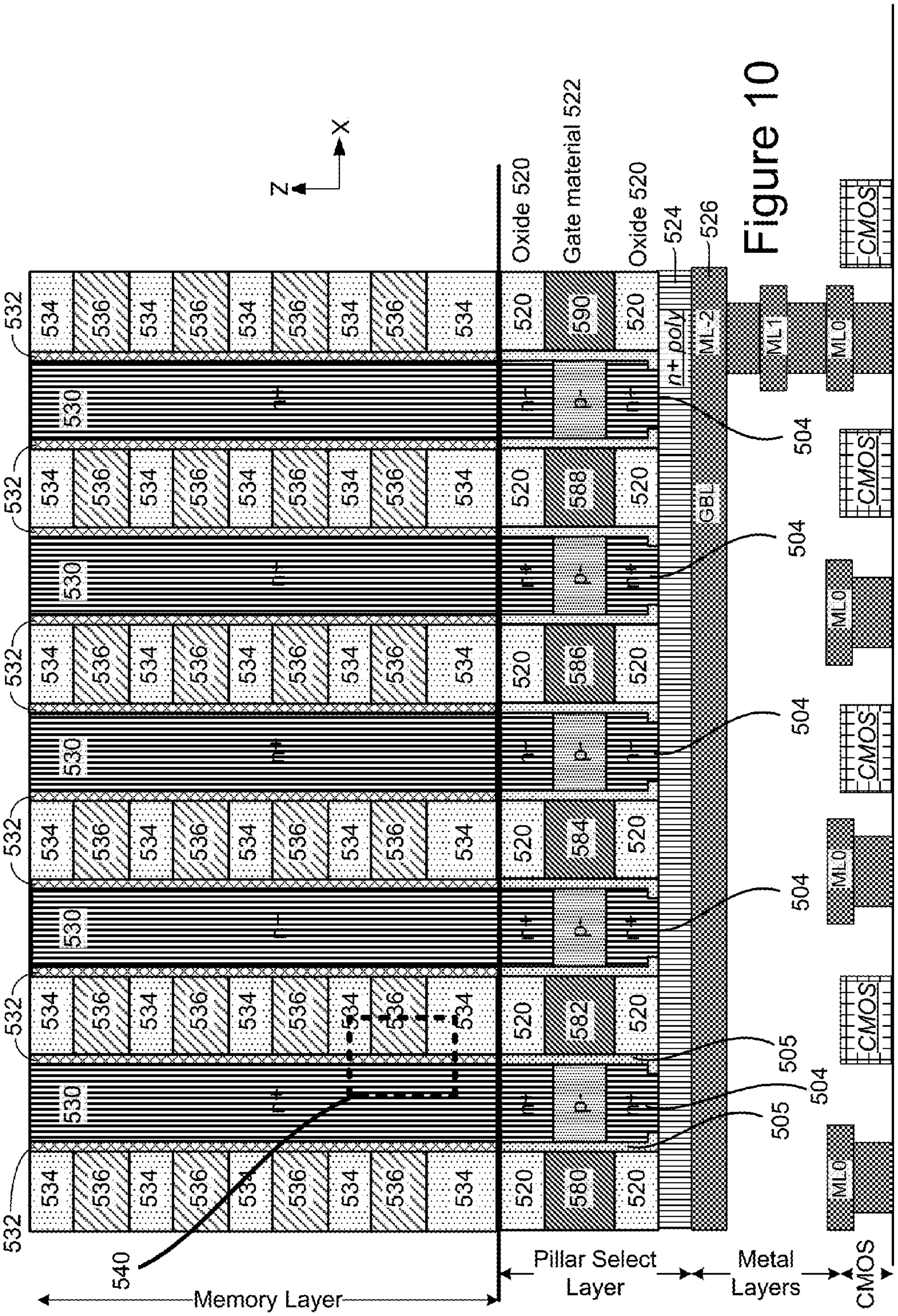
FIG. 10 illustrates one embodiment of a memory structure with vertical local bit lines above the substrate and vertically oriented select devices above the substrate that connect the bit lines to global bit lines.

FIG. 10 is a cross-sectional view of a memory structure using the vertically oriented select device discussed above and the memory structure of FIG. 6. As described below, the memory structure of FIG. 10 is a continuous mesh array of memory elements because there are memory elements connected to both sides of the bit lines and memory elements connected to both sides of the word lines. At the bottom of FIG. 10, the CMOS substrate is depicted. Implemented on the top surface of the CMOS structure are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 1), which are labeled in FIG. 10 as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 10 also shows an n+ polysilicon layer 524. As can be seen, the npn TFT of vertically oriented select devices 504 can be used to connect the global bit line GBL (layer 526) with any of the vertical bit lines 530.

FIG. 10 shows six row select lines ($SG_x$) 580, 582, 584, 586, 588 and 590 in the gate material layer 522, each underneath a stack of multiple word lines. As can be seen, each of the row select lines 580, 582, 584, 586, 588 and 590 is positioned between two vertically oriented select devices 504, above and not in the substrate. Therefore each row select line can serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

Figure 10A:
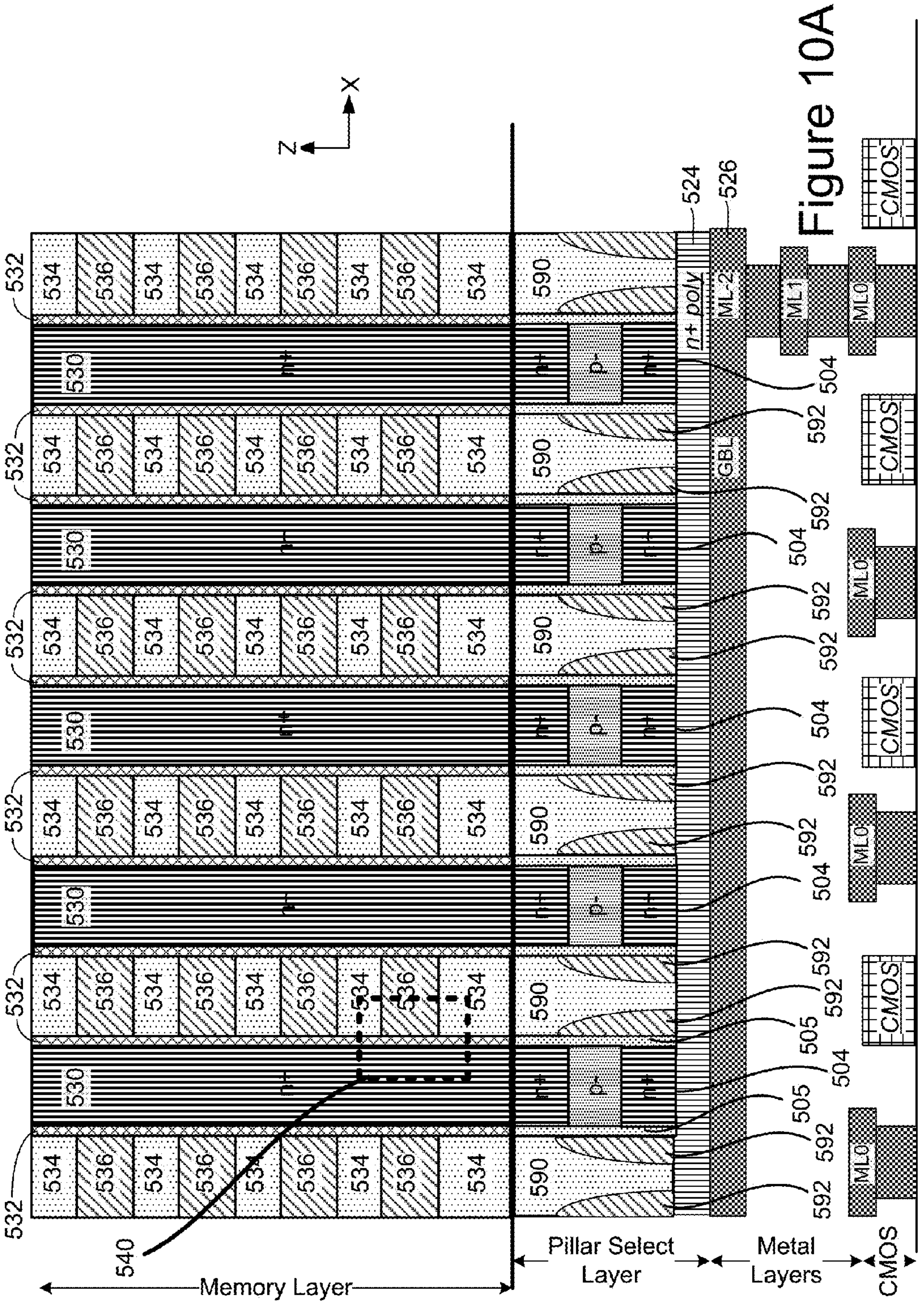
FIG. 10A illustrates one embodiment of a memory structure with vertical local bit lines above the substrate and vertically oriented select devices above the substrate that connect the bit lines to global bit lines.

FIG. 10A is a cross-sectional view of a memory structure that is the same as depicted in FIG. 10, except that oxide layers 520 have been replaced by oxide regions 590 and gate material 522 has been replaced by gate regions (row select lines) 592. The embodiment of FIG. 10A is referred to as the split gate structure. Each vertically oriented select device 504 is turned on by applying a high voltage on both neighboring row select lines 592.

Figure 11:
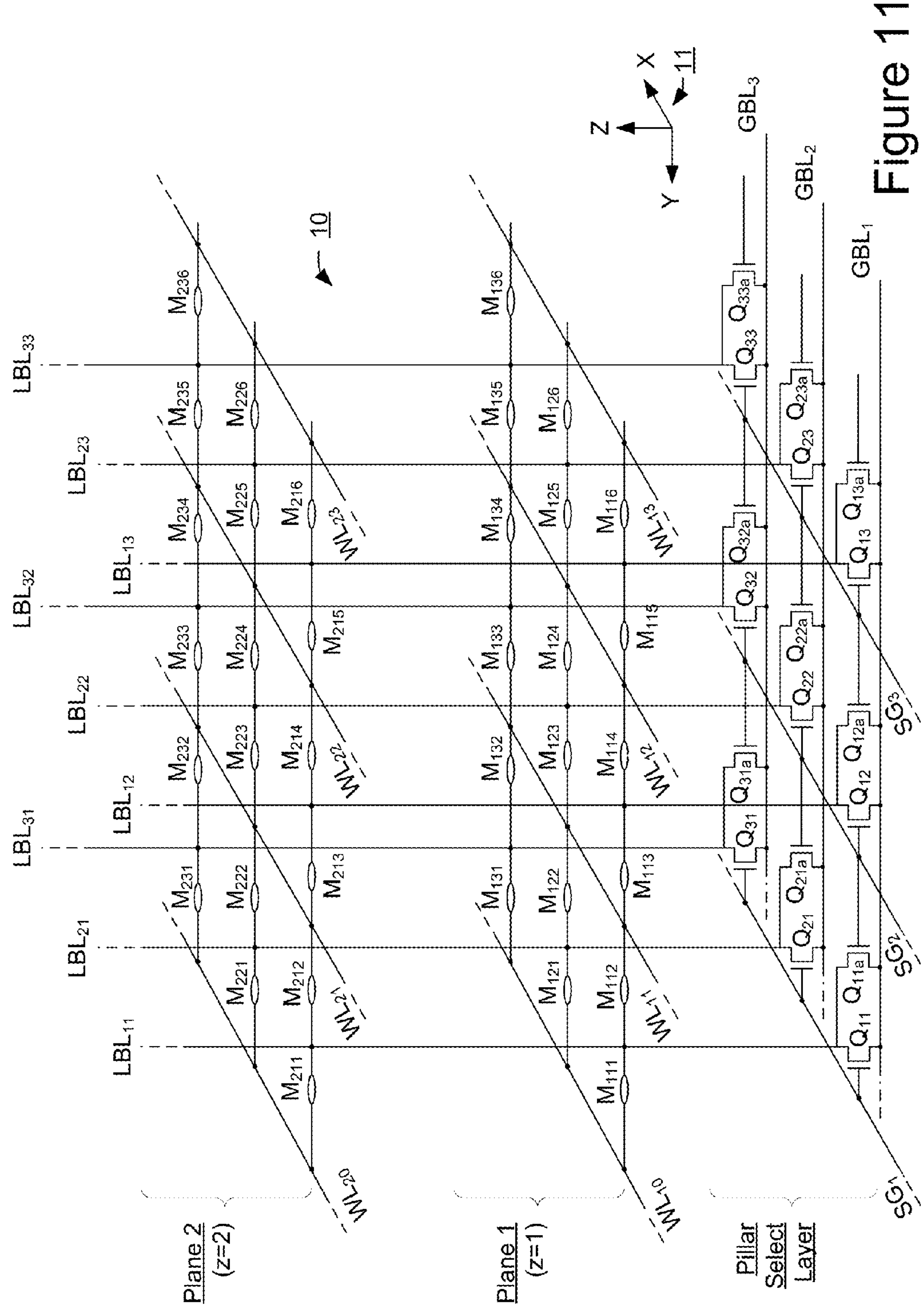
FIG. 11 is a schematic of a portion of the memory system, depicting vertical bit lines and vertically oriented select devices above the substrate.

FIG. 11 is a partial schematic of the memory system of FIG. 10 depicting the above-described double-gated structure for the vertically oriented select devices 504. Planes 1 and 2 of FIG. 11 are the same as in FIG. 1. As can be seen, each local bit line LBL is connectable to a respective global bit line GBL by two row select signals. FIG. 11 shows two transistors connecting to each local bit line. For example, transistor $Q_{11}$ can connect local bit line $LBL_{11}$ to global bit line $GBL_1$ in response to row select line $SG_1$ and transistor $Q_{11a}$ can connect local bit line $LBL_{11}$ to global bit line $GBL_1$ in response to row select line $SG_2$. The same structure is used for the other local bit lines depicted in FIG. 11.

Figure 12:
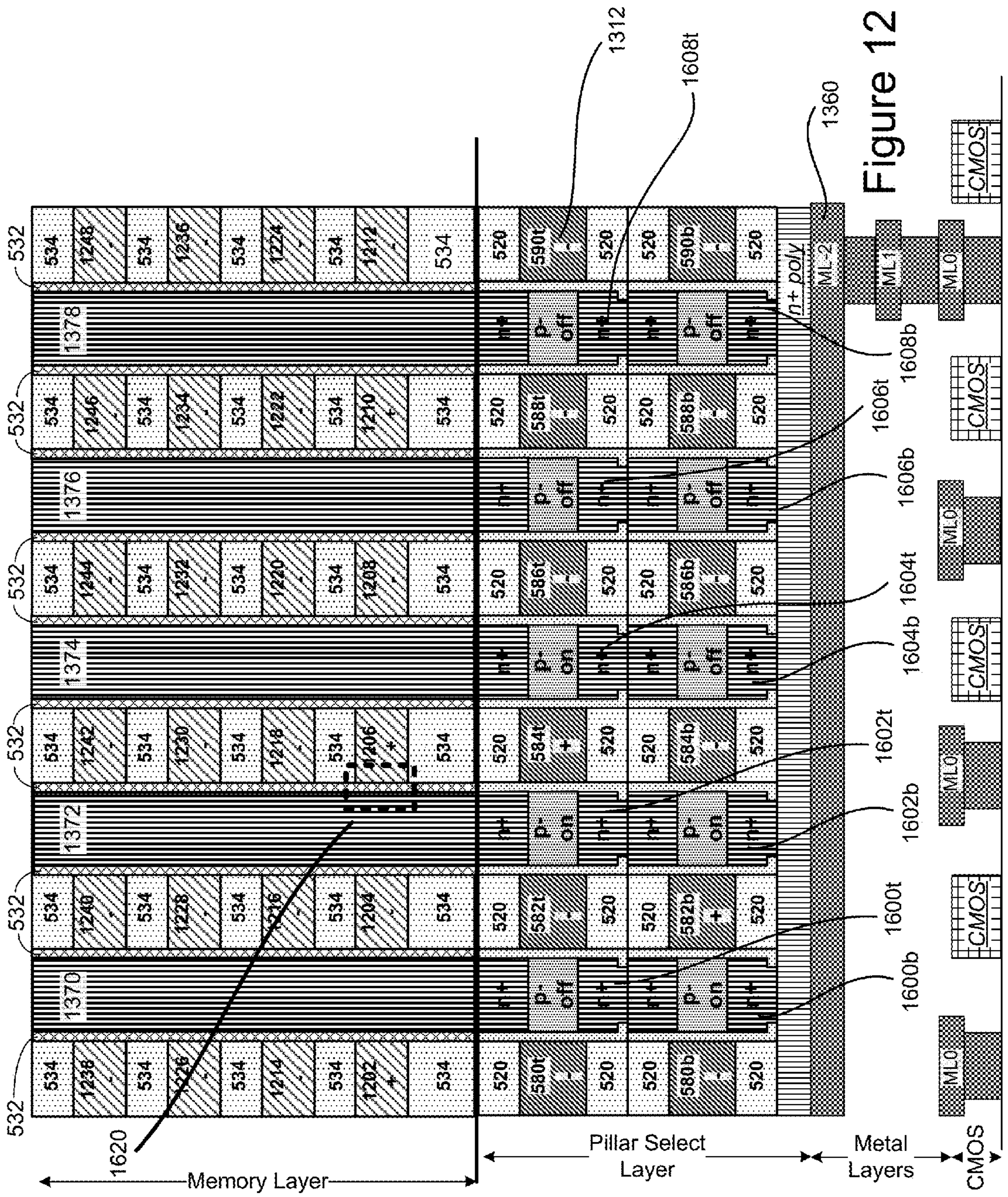
FIG. 12 depicts a cross section of a structure to implement another embodiment of a memory that includes two levels of row select lines and vertically oriented select devices.

FIG. 12 is a cross section of a structure of a memory providing another embodiment that allows for operation of the memory system and proper selection of memory elements where the word line comb structure (or other type of shape) is implemented. In the embodiment of FIG. 12 (which may include word line comb structures or other shapes), the vertically oriented select devices are symmetrical. Thus the oxide layers on each side are symmetrical. However, the embodiment of FIG. 12 includes two layers of vertically oriented select devices and two layers of row select lines. FIG. 12 shows a first layer of vertically oriented select devices including 1600*b*, 1602*b*, 1604*b*, 1606*b* and 1608*b*. A top and second layer of vertically oriented select devices includes 1600*t*, 1602*t*, 1604*t*, 1606*t* and 1608*t*. The bottom layer of row select lines includes 580*b*, 582*b*, 584*b*, 586*b*, 588*b*, and 590*b*. The top layer of row select lines includes 580*t*, 582*t*, 584*t*, 586*t*, 588*t*, and 590*t*.

Row select line 580*t* is formed on top of 580*b*. Row select line 582*t* is formed on top of row select line 580*b*. Row select line 584*t* is formed on top of row select line 584*b*. Row select line 586*t* is formed on top of row select line 586*b*. Row select line 588*t* is formed on top of row select line 588*b*. Row select line 590*t* is formed on top of row select line 590*b*.

Vertically oriented select device 1600*t* is formed on top of, connected to and in series with vertically oriented select device 1600*b*. Vertically oriented select device 1602*t* is formed on top of, connected to, and in series with vertically oriented select device 1602*b*. Vertically oriented select device 1604*t* is formed on top of, connected to and in series with vertically oriented select device 1604*b*. Vertically oriented select device 1606*t* is formed on top of, connected to, and in series with vertically oriented select device 1606*b*. Vertically oriented select device 1608*t* is formed on top of, connected to, and in series with vertically oriented select device 1608*b*.

In the embodiment of FIG. 12, in order for global bit line 1360 to be in communication with one of the local bit lines (1370, 1372, 1374, 1376 or 1378), both of the vertically oriented select devices underneath the appropriate local bit lines must be turned on. To turn on both switches (a top switch and a bottom switch), then a top row select line and a bottom row select line must be turned on. FIG. 12 shows row select line 584*t* as being selected ("+") by driving three volts and row select line 582*b* as being selected ("+") and driving three volts. Therefore, vertically oriented select device 1602*t* and vertically oriented select device 1602*b* will both turn on. Because row select line 584*t* is selected, vertically oriented select device 604*t* will also turn on. Because vertically oriented select device 604*b* is off, local bit line 1374 will not be selected and will not be in communication with global bit line 1360. Because row select line 582*b* is selected, vertically oriented select device 1600*b* will also turn on. Since vertically oriented select device 1600*t* is not turned on, local bit line 1370 will not be connected to or in communication with global bit line 1360. In this manner, only local bit line 1372 is selected. Memory element 1620 will undergo a memory operation. Therefore, in the structure of FIG. 12, a local bit line is selected by choosing a top row select line and a bottom row select line on opposite sides of the stack of two vertically oriented select devices. Each of the selected/activated row select lines are also connected to select devices adjacent to the intended target select device, for example, row select line 584*t* is also connected to select device 1604*t* which is adjacent to select device 1602*t*.

Figure 13:
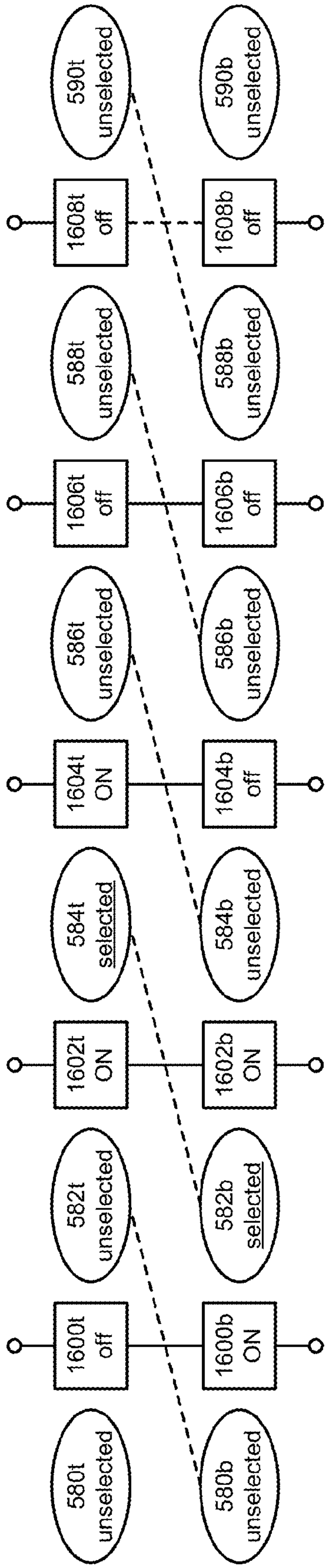
FIG. 13 is a block diagram depicting one example implementation of how to connect various row select lines.

FIG. 13 is a block diagram showing the two rows of row select lines and vertically oriented select devices from FIG. 12. In one embodiment, the structure of FIG. 12 may include double the amount of row select lines in the memory system. This may add a lot more signal lines which occupies valuable space. One proposal is to connect two row select lines within the block of memory elements. In one embodiment, diagonal row select lines will be connected (e.g., wired) together. For example, FIG. 13 shows row select line 582*b* being wired to row select line 584*t*. FIG. 13 also shows row select line 580*b* being wired to row select line 582*t*, row select line 584*b* being wired to row select line 586*t*, row select line 586*b* being wired to row select line 588*t*, and row select line 588*b* being wired to row select line 590*t*. Other arrangements for wiring the two row select lines together can also be used.

Figure 14:
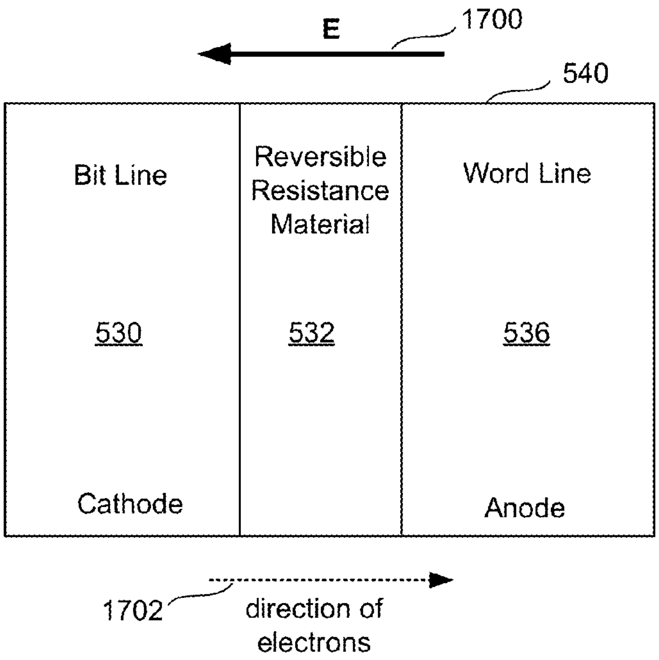
FIG. 14 depicts a memory element.

Looking back at FIG. 10, memory element 540 is identified using a dashed box. FIG. 14 depicts a close-up cross sectional view of memory element 540, including a portion of the material comprising the bit line 530, reversible resistance switching material 532 and a portion of the material comprising the word line 536. The portion of the material comprising the bit line 530 and the portion of the material comprising the word line 536 act as electrodes for memory element 540. In one embodiment, reversible resistance switching material 532 comprises a metal oxide material.

In one set of example implementations, (1) 20 nm n+ Si, 3 nm HfOx, 5-10 nm TiN; and (2) 20 nm n+ Si, 2 nm AlOx, 5-10 nm TiN are preferred sets of materials. Thin switching materials layers are less robust to the current surges and high fields needed to form the switching material. Nevertheless, the switching material thickness in many embodiments of this invention are reduced below 5 nm and preferably below 3 nm when in combination with a cathode electrode material with a low electron injection energy barrier to the switching material. Material choices are envisioned where the thickness of the switching material is reduced from typical values to be less than 3 nm and the cathode electrode material for forming has an energy barrier less than 1 eV to the switching material. Without being bound by any particular theory, the beneficial effect can be significant because both the material thickness reduction and the electron injection energy barrier reduction reduce the energy released in the forming event by electrons being injected into the switching material. Higher endurance and retention memory element are achieved.

Other buffer and barrier layers as required for processing and cell reliability can be added in some embodiments. For example, there may be a nm scale Titanium Oxide layer above or below the TiN layers. These buffer and barrier layers may be off ideal stoichoimetry.

The thicknesses are examples but various embodiments may be higher or lower. Highly defected metal oxide such as HfSiON, AlON, or AL doped HfOx are desirable in some embodiments for lower voltage operation and highest data retention memory cells.

Even with the same structure, the process condition such as annealing temperature and time can make a difference. In the example of 20 nm n+ Si/3 nm HfO2/10 nm n+ Si, the annealing condition after HfOx deposition should be at lower temperature and longer time (e.g., ~540 C. for 1 hour). The device after this annealing behaves differently than previous standard 750 C. 60 s RTA.

As described above, memory element 540 may be reversibly switched between two or more states. For example, the reversible resistance material 532 may be in an initial high resistance state upon fabrication that is switchable to a low resistance state upon application of a first voltage and/or current. Application of a second voltage and/or current may return the reversible resistivity-switching material to a high resistance state.

Figure 15:
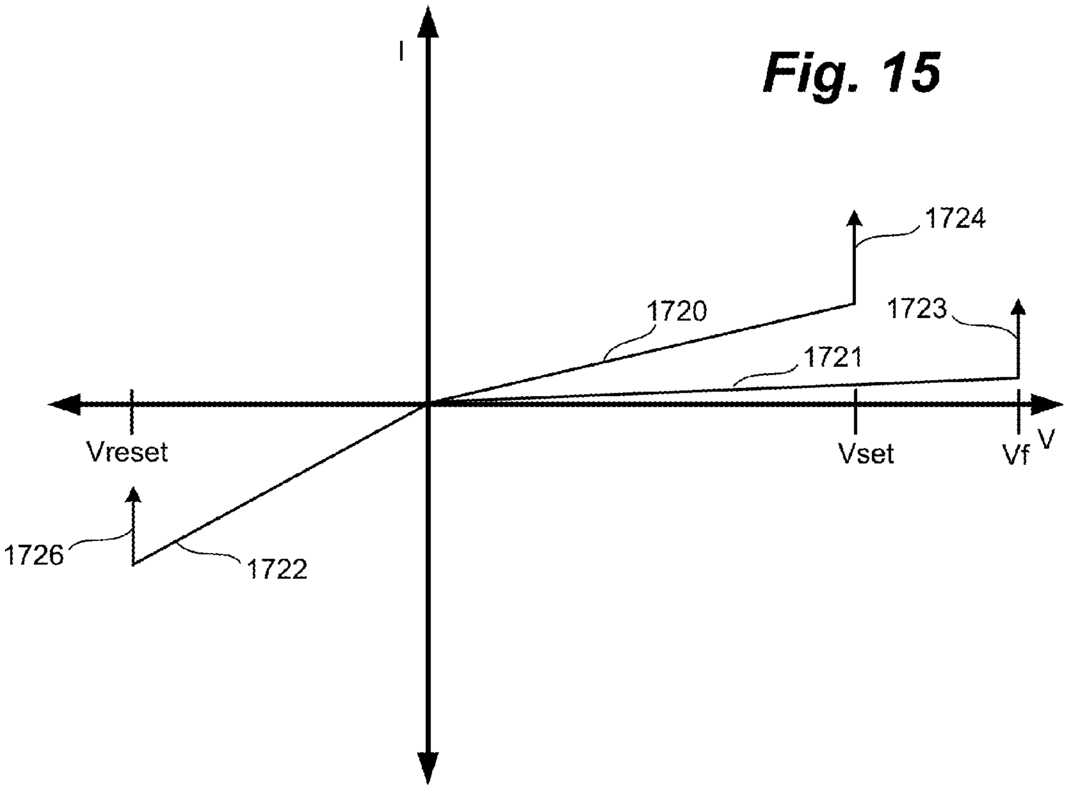
FIG. 15 is a graph of current versus voltage for a memory element, and is used to explain SET and RESET.

FIG. 15 is a graph of voltage versus current for one example embodiment of a metal oxide reversible resistance-switching memory element. Line 1720 represents the I-V characteristics of the reversible resistance-switching memory element when in the high resistance state (ROFF). Line 1722 represents the I-V characteristics of the reversible resistance-switching memory element when in the low resistance state (RON). Line 1721 represents the I-V characteristics of a fresh reversible resistance-switching memory element before forming.

To determine which state the reversible resistance-switching memory element is in, a voltage is applied and the resulting current is measured. A higher measured current indicates that the reversible resistance-switching memory element is in the low resistance state. A lower measured current indicates that the memory element is in the high resistance state. Note that other variations of a memory element having different I-V characteristics can also be used with the technology herein. In bipolar switching mode of operation suitable for many materials, the values of Vset and Vreset are opposite in polarity.

Before forming, a reversible resistance-switching memory element is considered fresh. If the forming voltage Vf and sufficient current is applied to a fresh reversible resistance-switching memory element, the memory element will be formed and will go into a low resistance condition (which, in some embodiments coincides with the low resistance state). Line 1723 shows the behavior when Vf is applied. The voltage will remain somewhat constant and the current will increase. At some point, the reversible resistance-switching memory element will be in the low resistance condition/state and the device behavior will be based on line 1722 or something like line 1722.

While in the high low resistance state (see line 1720), if the voltage Vset and sufficient current is applied, the memory element will be SET to the low resistance state. Line 1724 shows the behavior when Vset is applied. The voltage will remain somewhat constant and the current will increase. At some point, the reversible resistance-switching memory element will be SET to the low resistance state and the device behavior will be based on line 1722.

While in the low resistance state (see line 1722), if the voltage Vreset and sufficient current is applied, the memory element will be RESET to the high resistance state. Line 1726 shows the behavior when Vreset is applied. At some point, the memory element will be RESET and the device behavior will be based on line 1720. Note that in one embodiment, the magnitude of the forming voltage Vf may be greater than the magnitude of Vset, and the magnitude of Vset may be greater than the magnitude of Vreset.

In one embodiment, Vset is approximately 3.5 volts, Vreset is approximately −2 volts, Iset_limit is approximately 5 uA and the Ireset current could be as high as 30 uA.

Looking back at FIG. 14, the thickness of the reversible resistance material 532 is chosen so that the fresh memory element (before a FORMING process) is in range of 10 to 1000 times more resistive than desired high resistance state (after a RESET operation). In one embodiment, the thickness range is 3 nm or less; however, other ranges can also be used.

The materials of the memory element 540 (portion of the material comprising the bit line 530, reversible resistance switching material 532 and portion of the material comprising the word line 536) each have a work function (based on the conduction bands of a semi-conducting material or an electron affinity if a metallic material). When designing a memory element, the reversible resistance switching material 532 and the cathode are chosen so that electron injection energy barrier is less than 1 eV by matching work function of the electrode and electron affinity of the reversible resistance switching material 532, by reducing effective work function of the electrode, or by both effects.

In one embodiment, when creating the electrode (e.g., creating the vertical bit line), the silicon material is annealed. The annealing conditions are chosen to reduce trap depth of the reversible resistance switching material 532 to less than 1.0 eV. This is applicable if MeOx bulk conduction is dominated. Proper annealing conditions may also reduce the effective work function. Additionally (and optionally), cathode deposition conditions can be chosen to produce an interface layer between the cathode (e.g., bit line) and the reversible resistance switching material 532 which reduces effective work function of the cathode. Sputtering (e.g., Argon sputtering) can be used to reduce the work function of the electrode.

In some embodiments, the bit line can serve as the cathode and the word line as the anode, while in other embodiments the bit line can serve as the anode and the word line can serve as the cathode.

In one example implementation, the polarity of the FORMING voltage Vf is chosen so that the electrode with the lowest electrode to reversible resistance switching material barrier is chosen as the cathode. That is, the bit line to the reversible resistance switching material has a first electron injection energy barrier and the word line to the reversible resistance switching material has a second electron injection energy barrier. If the first electron injection energy barrier is less than the second electron injection energy barrier, then the bit line will be used as the cathode and the word line will be used as the anode. To achieve this, a positive forming voltage Vf is applied to the word line and ground is applied to the bit line. Alternatively, a higher positive voltage is applied to the word line, as compared to the bit line, such the difference in potential between the word line and the bit line is the forming voltage Vf. The bit line would be at a lower positive voltage potential than the word line. When the bit line serves as the cathode, the direction of the electric field is from the word line to the bit line (see arrow 1700 of FIG. 14) and the direction of electron injection into the reversible resistance switching material 532 is from the bit line to the word line (see arrow 1702 of FIG. 14). The cathode serves to emit electrons.

If the second electron injection energy barrier is less than the first electron injection energy barrier, then the word line will be used as the cathode and the bit line will be used as the anode. To achieve this, the positive forming voltage Vf is applied to the bit line and ground is applied to the word line. Alternatively, a higher positive voltage is applied to the bit line, as compared to the word line, such the difference in potential between the bit line and the word line is the forming voltage Vf. The word line would be at a lower voltage potential than the bit line.

Looking back at FIG. 10A, a split gate architecture is described. While this design does work well, it has some drawbacks in that the architecture limits the ability to scale the memory design and can result in a lower than ideal Idsat. Additionally, in some implementations, the TFT-gate thickness is so thin (e.g., ~10 nm) that the sheet-resistor of TFT-gate is very high (~2 K ohm/sq). Then, the RC switching delay of the selected TFT gate is very long (e.g., >1 us) to reduce the READ/WRITE performance. Therefore, in an array design, TFT-gate has to be segmented frequently to reduce RC with die size penalty.

A "shared-gate VTFT structure," shown in FIG. 12, may be used to overcome some of the aforementioned issues. The VTFT-gate (Vertical Thin Film Transistor Gate) is shared between adjacent VBL at the same side. The shared-gate VTFT (Vertical Thin Film Transistor) structure is able to solve the challenges noted above for the split gate architecture. However, in some cases, the shared-gate VTFT structure can suffer from unwanted disturbs on the half selected vertical bit lines.

One proposed solution to the disturb issue with the shared-gate VTFT structure is the stacked gate design depicted in FIG. 12. However, with the shared-gate structure Idsat is reduced (estimated: ~40% of split-gate) because of ½ of effective channel-width.

To overcome the challenges of the VTFT designs described above, the designs of FIGS. 16-18 are proposed.

Figure 16:
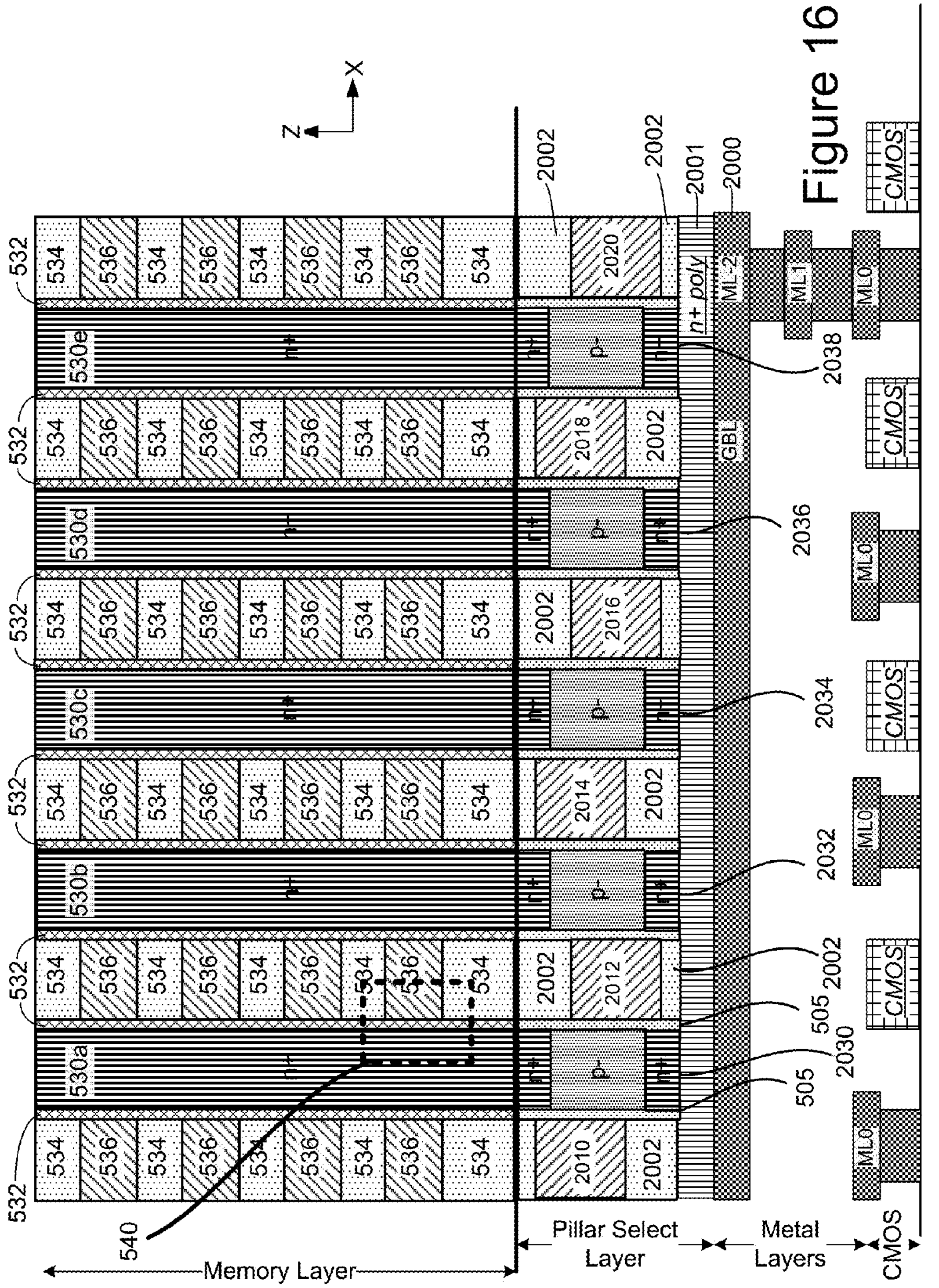
FIG. 16 illustrates one embodiment of a memory structure with vertical local bit lines above the substrate and vertically oriented select devices above the substrate that connect the bit lines to global bit lines.

FIG. 16 is a cross-sectional view of a memory structure using the proposed new vertically oriented select device. The memory structure of FIG. 16 is a continuous mesh array of memory elements because there are memory elements connected to both sides of the bit lines and memory elements connected to both sides of the word lines. The Memory Layer of FIG. 16 is the same as in FIG. 10, and includes a set of vertical bit lines 530*a*, 530*b*, 530*c*, 530*d* and 530*e*. In one embodiment, the vertical bit lines comprise N+ polysilicon. Interspersed between the vertical bit lines 530*a-e* are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

At the bottom of FIG. 16, the CMOS substrate is depicted. Implemented on the top surface of the CMOS structure are various metal lines including ML-0, ML-1, and ML-2. Line 2000 of ML-2 serves as a respective global bit line (GBL). The metal line ML-2 2000 serving as a global bit line can be implemented of any suitable material, including Tungsten, or Tungsten on a Titanium Nitride adhesion layer or a sandwich of n+ polysilicon on Tungsten on Titanium Nitride adhesion layer. The Pillar Select Layer includes the vertically oriented select devices, including their respective gates (2010, 2012, 2014, 2016, 2018 and 2020). The material forming the gates (2010, 2012, 2014, 2016, 2018 and 2020) can be polysilicon, Titanium Nitride, Tantalum Nitride, Nickel Silicide or any other suitable material. The gates (2010, 2012, 2014, 2016, 2018 and 2020) implement the row select lines $SG_x$ (e.g. $SG_1$, $SG_2$, . . . of FIG. 1).

Directly below each vertical bit line 530 are the vertically oriented select devices 2030, 2032, 2034, 2036 and 2038. Each of the vertically oriented select devices comprises (in one example embodiment) a n+/p−/n+ TFT (also referred to as a vertical thin film transistor, vertical TFT or VTFT). Each of the vertically oriented select devices 504 have oxide layers 505 on each side. FIG. 16 also shows an n+ polysilicon layer 2001. As can be seen, the npn TFT of vertically oriented select devices 504 can be used to connect the global bit line GBL (layer 2000) with any of the vertical bit lines 530*a*, 530*b*, 530*c*, 530*d* and 530*e*.

FIG. 16 shows six row select lines ($SG_x$) which are also the gates 2010, 2012, 2014, 2016, 2018 and 2020, each underneath a stack of multiple word lines. The gates/row select lines 2010, 2012, 2014, 2016, 2018 and 2020 are positioned underneath and between the vertical bit lines. However, the gates/row select lines 2010, 2012, 2014, 2016, 2018 and 2020 are above and not in the substrate. FIG. 26 also shows oxide regions 2002.

Each row select line 2010, 2012, 2014, 2016, 2018 and 2020 can serve as the gate signal to either of the two neighboring vertically oriented select devices 2030, 2032, 2034, 2036 and 2038; therefore, the vertically oriented select devices 2030, 2032, 2034, 2036 and 2038 are said to be double gated. Each vertically oriented select device 2030, 2032, 2034, 2036 and 2038 is controlled by two different row select lines, in this embodiment. One aspect of the vertically oriented select devices 2030, 2032, 2034, 2036 and 2038 incorporated to the base portion of each bit line pillar is that two adjacent vertically oriented select devices 2030, 2032, 2034, 2036 and 2038 share the same gate region. This allows the vertically oriented select devices to be closer together. As can be seen, although each vertically oriented select devices 2030, 2032, 2034, 2036 and 2038 has two gates, the vertically oriented select devices have only one gate on each side. For example, vertically oriented select devices 2034 has only gate 2014 on one side and has only gate 2016 on the other side. As can be seen from FIG. 16, the first of the two gates is adjacent to a drain of the double gated vertically oriented select device but not adjacent to a source of the double gated vertically oriented select device and a second of the two gates is adjacent to the source of the double gated vertically oriented select device but not adjacent to the drain of the double gated vertically oriented select device. For example with respect to vertically oriented select devices 2034, gate 2014 is adjacent the top n+ region but not adjacent to the bottom n+ region, while gate 2016 is adjacent the bottom n+ region but not adjacent to the top n+ region. Also each of the vertically oriented select devices 2030, 2032, 2034, 2036 and 2038 comprises a single TFT with two source/drain regions.

Note that the gates/row select lines 2010, 2012, 2014, 2016, 2018 and 2020 are not all at the same vertical position. Rather, they are staggered with gates/row select lines 2010, 2014, and 2018 being offset and higher than gates/row select lines 2012, 2016, and 2020. By the term "higher" meant that the gates/row select lines 2010, 2014, and 2018 are further in distance from the substrate than gates/row select lines 2012, 2016, and 2020.

Figure 16A:
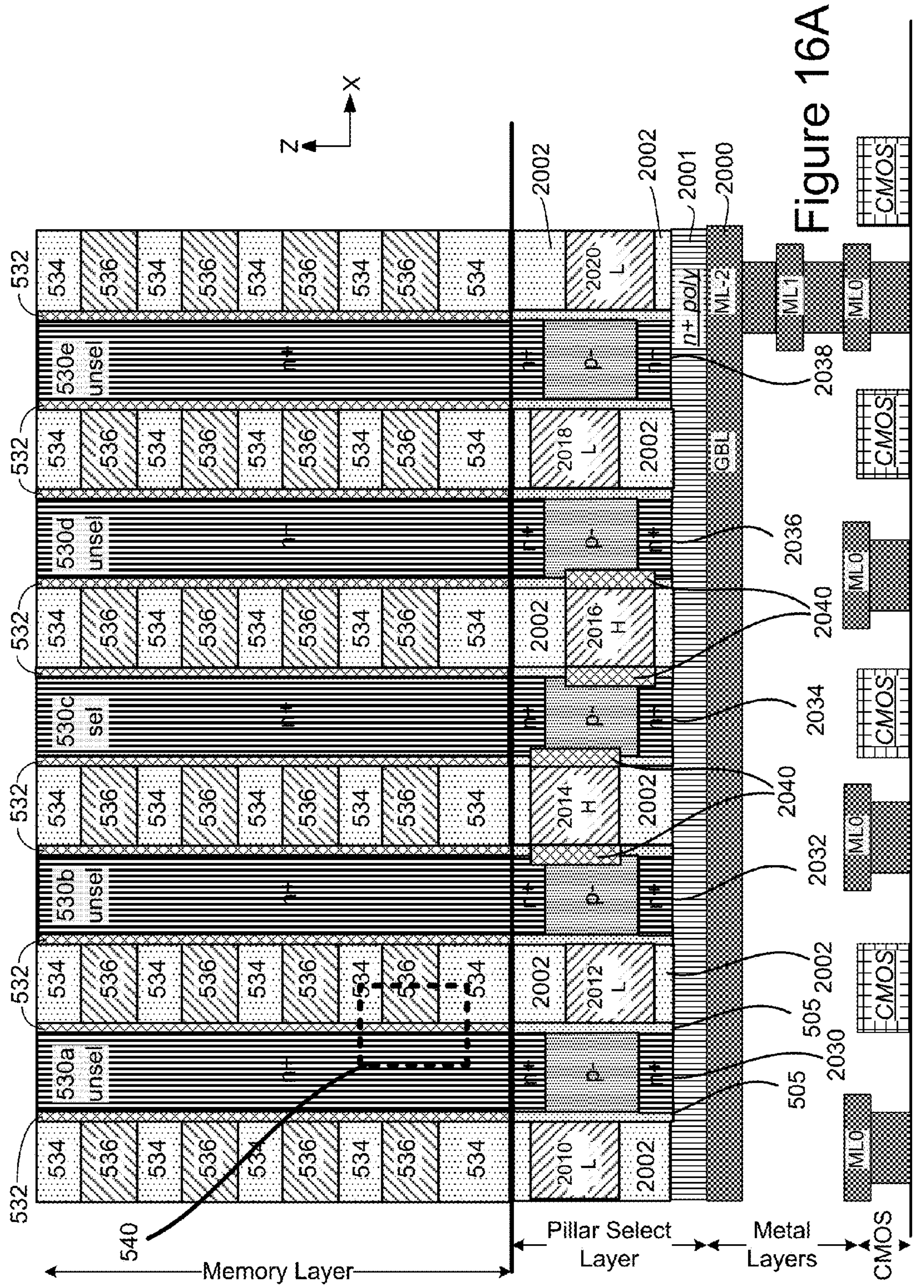
FIG. 16A illustrates one embodiment of a memory structure with vertical local bit lines above the substrate and vertically oriented select devices above the substrate that connect the bit lines to global bit lines.

When programming, both gates/row select lines for a vertically oriented select device 2030, 2032, 2034, 2036 and 2038 are put in the "on" condition. For example, both gates/row select lines for a vertically oriented select device receive a high voltage, which turns on (or activates) the respective vertically oriented select device to put the vertically oriented bit lines are in communication with the global bit lines. This is illustrated in FIG. 16A, FIG. 16A shows the structure of FIG. 16, with vertically oriented bit line 530*c* selected (sel) for an operation, while the other vertically oriented bit lines remain unselected (unsel). To accomplish this, one or more high voltages are applied to gates/row select lines 2014 and 2016 to turn on (actuate) vertically oriented select devices 2034. When one or more high voltages are applied to gates/row select lines 2014 and 2016, channels 2040 are formed on both sides (two channels, one for each gate) of the selected vertically oriented select device 2034 and on one side of unselected vertically oriented select devices 2032 and 2036. As can be seen, for a given vertically oriented select device, the two channels are offset (with respect to distance to the substrate) from each other. During the programming operation, the two source/drain regions are depleted and short the two channels of the vertically oriented select device.

Figure 17:
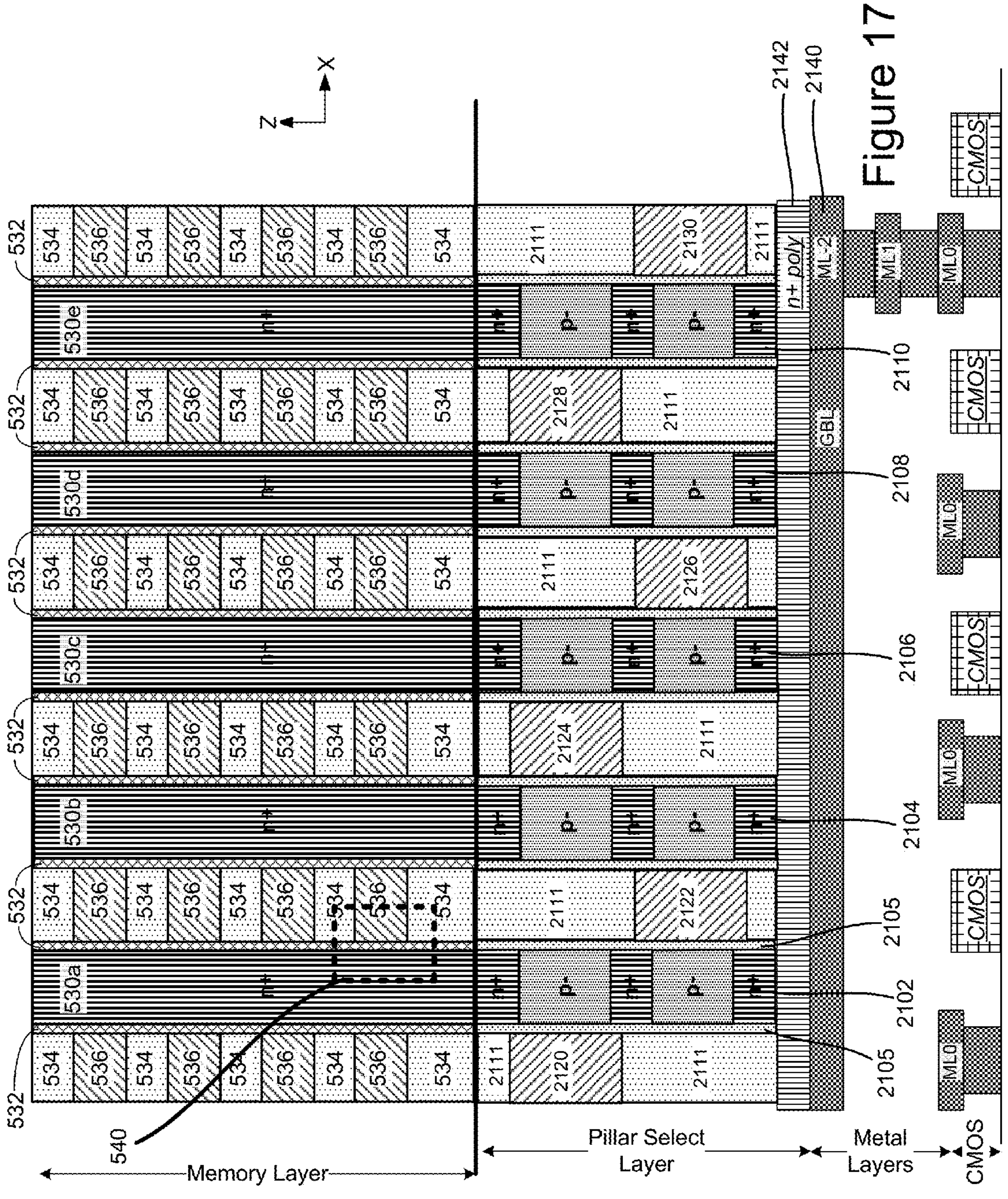
FIG. 17 illustrates one embodiment of a memory structure with vertical local bit lines above the substrate and vertically oriented select devices above the substrate that connect the bit lines to global bit lines.

FIG. 17 is a cross-sectional view of a memory structure using another embodiment of the proposed new vertically oriented select device and the memory structure of FIGS. 6 & 10. The memory structure of FIG. 17 is a continuous mesh array of memory elements because there are memory elements connected to both sides of the bit lines and memory elements connected to both sides of the word lines. The Memory Layer of FIG. 17 is the same as in FIG. 10, and includes a set of vertical bit lines 530*a*, 530*b*, 530*c*, 530*d* and 530*e*. In one embodiment, the vertical bit lines comprise N+ polysilicon. Interspersed between the vertical bit lines 530*a-e* are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

At the bottom of FIG. 17, the CMOS substrate is depicted. Implemented on the top surface of the CMOS structure are various metal lines including ML-0, ML-1, and ML-2. Line 2140 of ML-2 serves as a respective global bit line (GBL). The metal line ML-2 2140 serving as a global bit line can be implemented of any suitable material, including Tungsten, or Tungsten on a Titanium Nitride adhesion layer or a sandwich of n+ polysilicon on Tungsten on Titanium Nitride adhesion layer. The Pillar Select Layer includes the vertically oriented select devices (2102, 2104, 2106, 2108 and 2110), including their respective gates (2120, 2122, 2124, 2126, 2128, 2130). The material forming the gates (2120, 2122, 2124, 2126, 2128, 2130) can be polysilicon, Titanium Nitride, Tantalum Nitride, Nickel Silicide or any other suitable material. The gates (2120, 2122, 2124, 2126, 2128, 2130) implement the row select lines $SG_x$ (e.g. $SG_1$, $SG_2$, . . . of FIG. 1).

Directly below each vertical bit line 530*a-e* are the vertically oriented select devices 2102, 2104, 2106, 2108 and 2110. Each of the vertically oriented select devices have oxide layers 2105 on each side. FIG. 17 also shows an n+ polysilicon layer 2142. As can be seen, the npn TFTs of vertically oriented select devices can be used to connect the global bit line GBL (layer 2140) with any of the vertical bit lines 530*a*, 530*b*, 530*c*, 530*d* and 530*e*.

FIG. 17 shows six row select lines ($SG_x$) which are also the gates 2120, 2122, 2124, 2126, 2128, 2130, each underneath a stack of multiple word lines. The gates/row select lines 2120, 2122, 2124, 2126, 2128, 2130 are positioned underneath and between the vertical bit lines. However, the gates/row select lines 2120, 2122, 2124, 2126, 2128, 2130 are above and not in the substrate (CMOS). FIG. 26 also shows oxide regions 2111.

Each row select line 2120, 2122, 2124, 2126, 2128, 2130 can serve as the gate signal to either of the two neighboring vertically oriented select devices 2030, 2032, 2034, 2036 and 2038; therefore, the vertically oriented select devices 2102, 2104, 2106, 2108 and 2110 are said to be double gated. Each vertically oriented select device 2102, 2104, 2106, 2108 and 2110 is controlled by two different row select lines, in this embodiment. One aspect of the vertically oriented select devices 2102, 2104, 2106, 2108 and 2110 incorporated to the base portion of each bit line pillar is that two adjacent vertically oriented select devices 2102, 2104, 2106, 2108 and 2110 share the same gate region. This allows the vertically oriented select devices to be closer together. As can be seen, although each vertically oriented select device 2102, 2104, 2106, 2108 and 2110 has two gates, the vertically oriented select devices have only one gate on each side. For example, vertically oriented select devices 2106 has only gate 2124 on one side and has only gate 2126 on the other side. As can be seen from FIG. 26, the first of the two gates is adjacent to the top npn TFT but not adjacent to the lower npn TFT and a second of the two gates is adjacent to the lower non TFT but not adjacent to the upper npn TFT. For example with respect to vertically oriented select devices 2106, gate 2124 is adjacent the top npn TFT but not adjacent to the bottom npn TFT, while gate 2116 is adjacent the bottom npn TFT but not adjacent to the top npn TFT.

Note that the gates/row select lines 2120, 2122, 2124, 2126, 2128, 2130 are not all at the same vertical position. Rather, they are staggered with gates/row select lines 2120, 2124, and 2128 being offset and higher than gates/row select lines 2122, 2126, and 2130. By the term "higher" meant that the gates/row select lines 2120, 2124, and 2128 are further in distance from the substrate than gates/row select lines 2122, 2126, and 2130.

Each of the vertically oriented select devices comprises (in one example embodiment) two n+/p−/n+ TFTs in series. The p− region can be referred to as the middle conductivity regions because for a given TFT with three conductivity regions, the p− region s in the middle. Thus, each of the vertically oriented select devices includes two middle conductivity regions between source/drain regions (e.g., n+ regions). A first of the two gates for each vertically oriented select device is adjacent to a first conductivity region of the two middle conductivity regions but not adjacent to a second conductivity region of the middle conductivity regions and a second of the two gates is adjacent to the second conductivity region of the middle conductivity regions but not adjacent to the first conductivity region of the conductivity regions. For example, gate 2124 is adjacent the top p− region of vertically oriented select device 2106, while gate 2126 is adjacent the bottom p− region of vertically oriented select device 2106. Therefore, gate 2124 is part of the top transistor, while gate 2126 is part of the bottom transistor of vertically oriented select device 2106. Current from the selected global bit line 2140 passes through both of the two transistors when the double gated vertically oriented select device is in the "on" condition.

Figure 17A:
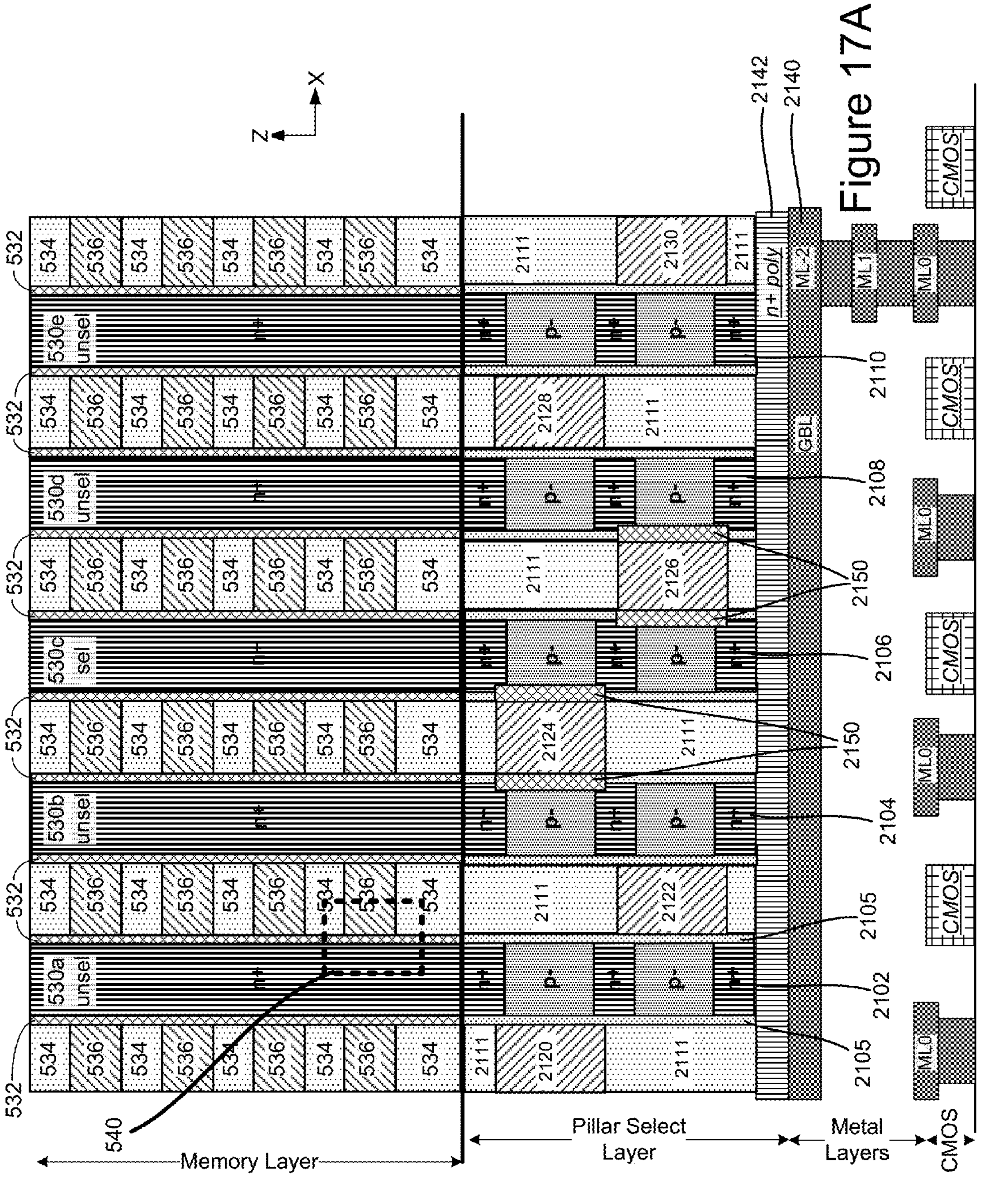
FIG. 17A illustrates one embodiment of a memory structure with vertical local bit lines above the substrate and vertically oriented select devices above the substrate that connect the bit lines to global bit lines.

When programming, both gates/row select lines for a vertically oriented select device 2102, 2104, 2106, 2108 and 2110 are put in the "on" condition. For example, both gates/row select lines for a vertically oriented select device receive a high voltage, which turns on (or activates) the respective vertically oriented select device to put the vertically oriented bit lines in communication with the global bit lines. This is illustrated in FIG. 17A. Note that the upper and lower gates can receive different voltages, with one being used as the higher voltage enable-signal and the other being used as the lower current-limit.

FIG. 17A shows the structure of FIG. 17, with vertically oriented bit line 530*c* selected (sel) for an operation, while the other vertically oriented bit lines remain unselected (unsel). To accomplish this, one or more high voltages are applied to gates/row select lines 2124 and 2126 to turn on (actuate) vertically oriented select device 2106. When one or more high voltages are applied to gates/row select lines 2124 and 2126, channels 2150 are formed on both sides (two channels, one for each gate) of the selected vertically oriented select device 2106 and on one side of unselected vertically oriented select devices 2104 and 2108. As can be seen, for a given vertically oriented select device, the two channels are offset (with respect to distance to the substrate) from each other, with one channel positioned in the top npn TFT and the other channel positioned in the bottom npn TFT.

Figure 18:
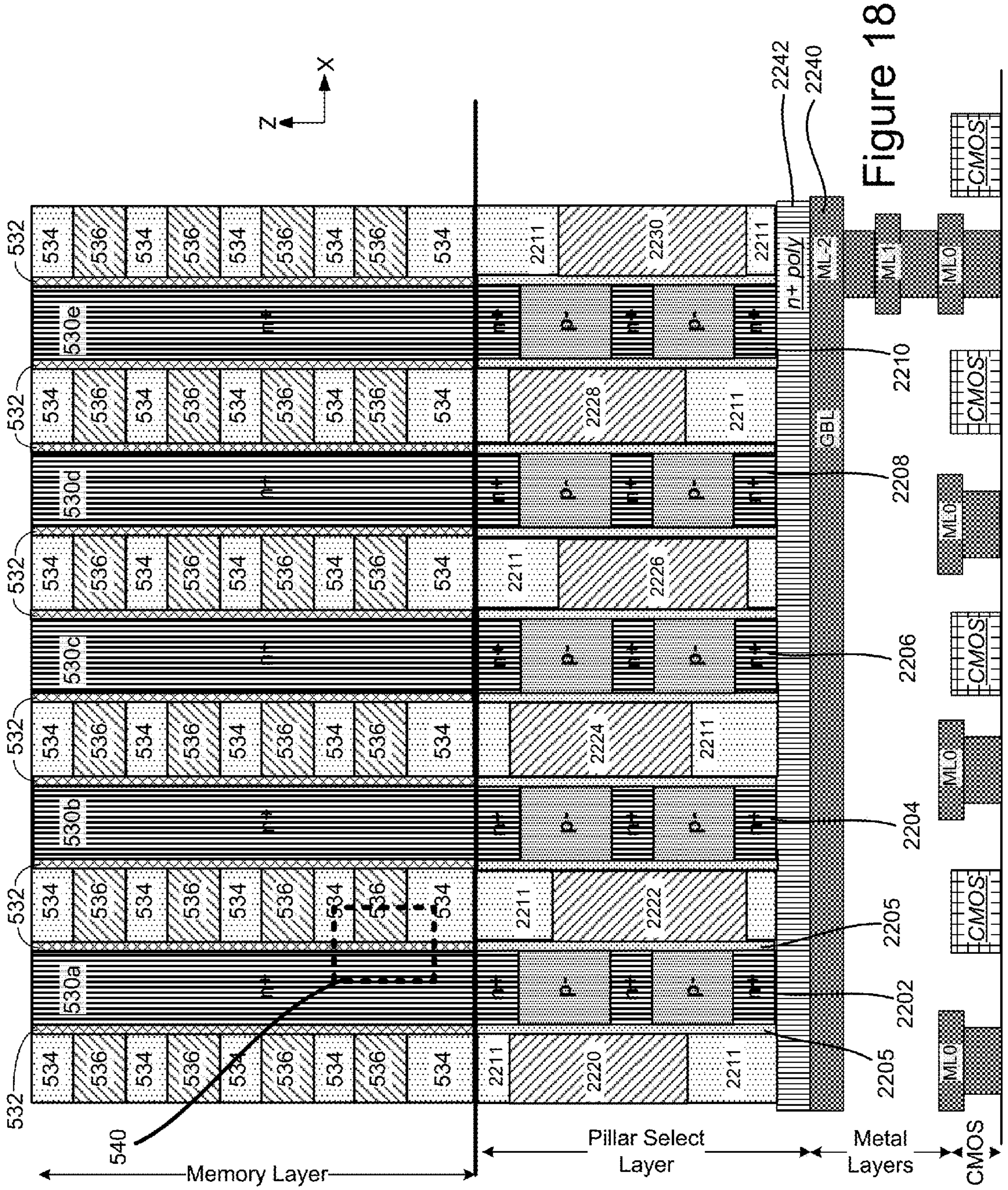
FIG. 18 illustrates one embodiment of a memory structure with vertical local bit lines above the substrate and vertically oriented select devices above the substrate that connect the bit lines to global bit lines.

FIG. 18 is a cross-sectional view of a memory structure using another embodiment of the proposed new vertically oriented select device. The memory structure of FIG. 18 is a continuous mesh array of memory elements because there are memory elements connected to both sides of the bit lines and memory elements connected to both sides of the word lines. The Memory Layer of FIG. 18 is the same as in FIG. 10, and includes a set of vertical bit lines 530*a*, 530*b*, 530*c*, 530*d* and 530*e*. In one embodiment, the vertical bit lines comprise N+ polysilicon. Interspersed between the vertical bit lines 530*a-e* are alternating oxide layers 534 and word line layers 536. In one embodiment, the word lines are made from TiN. Between the vertical bit lines 530 and the stacks of alternating oxide layers 536 and word line layers 536 are vertically oriented layers of reversible resistance switching material 532. In one embodiment the reversible resistance switching material is made of Hafnium Oxide $HfO_2$. However, other materials (as described above) can also be used. Box 540 depicts one example memory element which includes the reversible resistance switching material 532 sandwiched between a word line 536 and vertical bit line 530. The memory elements are positioned above, and not in, the substrate.

At the bottom of FIG. 18, the CMOS substrate is depicted. Implemented on the top surface of the CMOS structure are various metal lines including ML-0, ML-1, and ML-2. Line 2240 of ML-2 serves as a respective global bit line (GBL). The metal line ML-2 2240 serving as a global bit line can be implemented of any suitable material, including Tungsten, or Tungsten on a Titanium Nitride adhesion layer or a sandwich of n+ polysilicon on Tungsten on Titanium Nitride adhesion layer. The Pillar Select Layer includes the vertically oriented select devices (2102, 2104, 2106, 2108 and 2110), including their respective gates (2220, 2222, 2224, 2226, 2228, 2230). The material forming the gates (2220, 2222, 2224, 2226, 2228, 2230) can be polysilicon, Titanium Nitride, Tantalum Nitride, Nickel Silicide or any other suitable material. The gates (2220, 2222, 2224, 2226, 2228, 2230) implement the row select lines $SG_x$ (e.g. $SG_1$, $SG_2$, . . . of FIG. 1). FIG. 18 also shows oxide regions 2211.

Directly below each vertical bit line 530*a-e* are the vertically oriented select devices 2202, 2204, 2206, 2208 and 2210. Each of the vertically oriented select devices have oxide layers 2205 on each side. FIG. 26 also shows an n+ polysilicon layer 2242. As can be seen, the npn TFTs of vertically oriented select devices can be used to connect the global bit line GBL (layer 2140) with any of the vertical bit lines 530*a*, 530*b*, 530*c*, 530*d* and 530*e*.

FIG. 18 shows six row select lines ($SG_x$) which are also the gates 2220, 2222, 2224, 2226, 2228, 2230, each underneath a stack of multiple word lines. The gates/row select lines 2220, 2222, 2224, 2226, 2228, 2230 are positioned underneath and between the vertical bit lines. However, the gates/row select lines 2220, 2222, 2224, 2226, 2228, 2230 are above and not in the substrate (CMOS).

Each row select line 2220, 2222, 2224, 2226, 2228, 2230 can serve as the gate signal to either of the two neighboring vertically oriented select devices 2030, 2032, 2034, 2036 and 2038; therefore, the vertically oriented select devices 2202, 2204, 2206, 2208 and 2210 are said to be double gated. Each vertically oriented select device 2202, 2204, 2206, 2208 and 2210 is controlled by two different row select lines, in this embodiment. One aspect of the vertically oriented select devices 2202, 2204, 2206, 2208 and 2210 incorporated to the base portion of each bit line pillar is that two adjacent vertically oriented select devices 2202, 2204, 2206, 2208 and 2210 share the same gate region. This allows the vertically oriented select devices to be closer together. As can be seen, although each vertically oriented select device 2202, 2204, 2206, 2208 and 2210 has two gates, the vertically oriented select devices have only one gate on each side. For example, vertically oriented select devices 2206 has only gate 2224 on one side and has only gate 2226 on the other side.

Note that the gates/row select lines 2220, 2222, 2224, 2226, 2228, 2230 are not all at the same vertical position. Rather, they are staggered with gates/row select lines 2220, 2224, and 2228 being offset and higher than gates/row select lines 2222, 2226, and 2230. By the term "higher" meant that the gates/row select lines 2220, 2224, and 2228 are further in distance from the substrate than gates/row select lines 2222, 2226, and 2230.

Each of the vertically oriented select devices comprises (in one example embodiment) two n+/p−/n+TFTs in series. The p− region can be referred to as the middle conductivity regions because for a given TFT with three conductivity regions, the p− region s in the middle. Thus, each of the vertically oriented select devices includes two middle conductivity regions between source/drain regions (e.g., n+ regions). Each gate/row select line 2220, 2222, 2224, 2226, 2228, 2230 is adjacent to both the top and bottom middle conductivity regions for a particular vertically oriented select device. However, each gate/row select line 2220, 2222, 2224, 2226, 2228, 2230 is part of only one of the top and bottom npn TFTs for a particular vertically oriented select device because each gate/row select line only completely overlaps with one of the top and bottom middle conductivity regions for a particular vertically oriented select device. Current from the selected global bit line 2140 passes through both of the two transistors when the double gated vertically oriented select device is in the "on" condition.

Figure 18A:
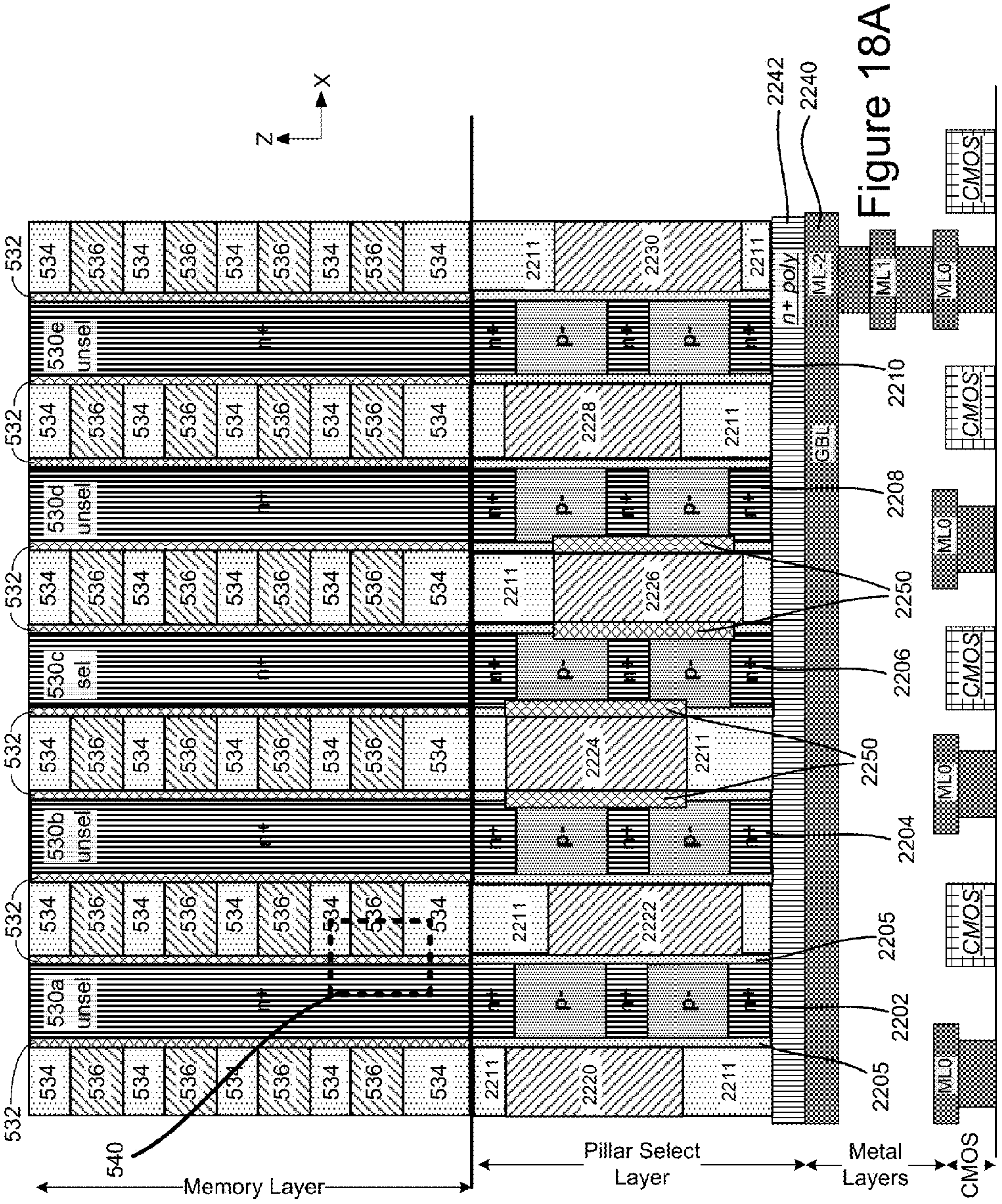
FIG. 18A illustrates one embodiment of a memory structure with vertical local bit lines above the substrate and vertically oriented select devices above the substrate that connect the bit lines to global bit lines.

When programming, both gates/row select lines for a vertically oriented select device 2202, 2204, 2206, 2208 and 2210 are put in the "on" condition. For example, both gates/row select lines for a vertically oriented select device receive a high voltage, which turns on (or activates) the respective vertically oriented select device to put the vertically oriented bit lines in communication with the global bit lines. This is illustrated in FIG. 18A. Note that the upper and lower gates may receive different voltages, with one being used as the higher voltage enable-signal and the other being used as the lower current-limit.

FIG. 18A shows the structure of FIG. 26, with vertically oriented bit line 530*c* selected (sel) for an operation, while the other vertically oriented bit lines remain unselected (unsel). To accomplish this, one or more high voltages are applied to gates/row select lines 2224 and 2226 to turn on (actuate) vertically oriented select device 2206. When one or more high voltages are applied to gates/row select lines 2224 and 2226, channels 2250 are formed on both sides (two channels, one for each gate) of the selected vertically oriented select device 2206 and on one side of unselected vertically oriented select devices 2204 and 2208. As can be seen, for a given vertically oriented select device, the two channels are offset (with respect to distance to the substrate) from each other, with one channel positioned in the top npn TFT and the other channel positioned in the bottom npn TFT.

In some embodiments, a dual gate structure for a vertical TFT may be formed by performing a first etching process that includes forming a first set of trenches by etching a first set of oxide pillars to a first depth and forming a second set of trenches by etching a second set of oxide pillars to a second depth higher than the first depth, forming a first set of gate structures within the first set of trenches, forming a second set of gate structures within the second set of trenches, performing a second etching process that includes forming a third set of trenches by etching the first set of gate structures from a second initial depth to a third depth and forming a fourth set of trenches by etching the second set of gate structures to a fourth depth higher than the third depth.

Figure 19A:
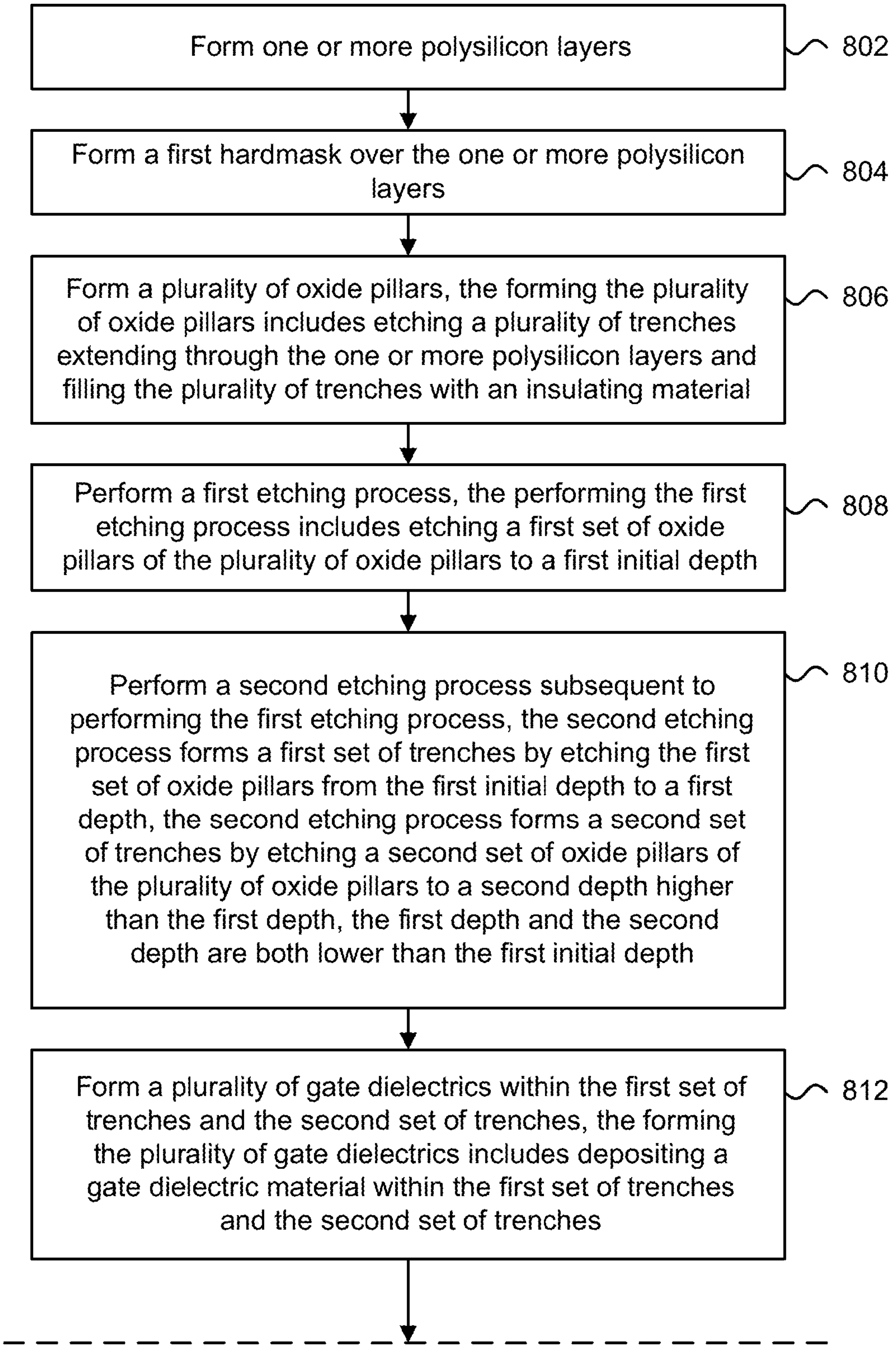
FIGS. 19A-19B depict a flowchart describing one embodiment of a process for forming a dual gate structure for a vertical TFT.
Figure 19B:
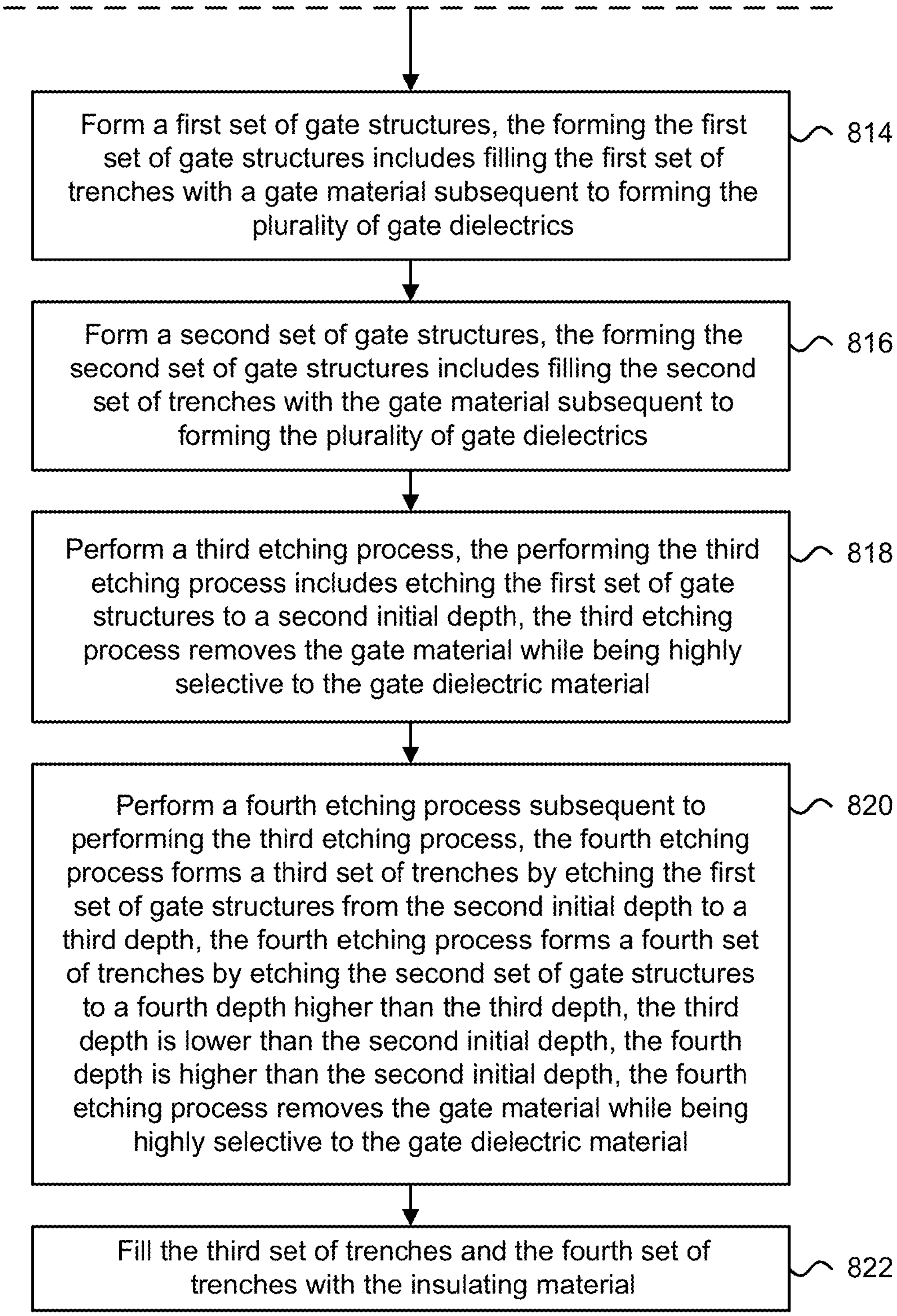

FIGS. 19A-19B depict a flowchart describing one embodiment of a process for forming a dual gate structure for a vertical TFT. The flowchart may omit common processing steps (e.g., the formation of isolation regions or structures, various implant and annealing steps, the formation of vias/contacts, the formation of a passivation layer, planarization, etc.) in order to highlight the processing steps described.

FIGS. 20A-20I depict various embodiments of processes for forming a dual gate structure for a vertical TFT. FIGS. 20A-20I may depict various stages of fabrication using cross-sectional views and may be referred to when describing the process of FIGS. 19A-19B.

Referring to FIGS. 19A-19B, in step 802, one or more polysilicon layers are formed. In one embodiment, the one or more polysilicon layers may be formed over one or more global bit lines or above a global bit line layer. The one or more polysilicon layers may be formed over an n+ polysilicon layer, such as n+ polysilicon layer 2142 in FIG. 17 or n+ polysilicon layer 2242 in FIG. 18. In another embodiment, the one or more polysilicon layers may be formed over a substrate, such as a silicon substrate or glass substrate. The one or more polysilicon layers may comprise a first n-type polysilicon layer, a second p-type polysilicon layer formed over the first n-type polysilicon layer, a third n-type polysilicon layer formed over the second p-type polysilicon layer, a fourth p-type polysilicon layer formed over the third n-type polysilicon layer, and a fifth n-type polysilicon layer formed over the fourth p-type polysilicon layer. The one or more polysilicon layers may be formed using poly deposition techniques and/or ion implantation in order to form the layers of n-type and p-type polysilicon. The polysilicon layers may be deposited using various deposition techniques such as chemical vapor deposition (CVD), physical vapor deposition (PVD), or atomic layer deposition (ALD). In some cases, the second p-type polysilicon layer may be associated with a first transistor channel of a vertical TFT and the fourth p-type polysilicon layer may be associated with a second transistor channel of the vertical TFT. In this case, the vertical TFT may be placed into a conducting state when both the first transistor channel and the second transistor channel are inverted (or inversion layers are formed at surfaces of both of the polysilicon layers).

In step 804, a first hardmask is formed over the one or more polysilicon layers. The first hardmask may comprise a layer of nitride or TiN. The first hardmask may be used as a hardmask during various process steps including oxide CMP, oxide recess (e.g., during steps 808 and 810), gate CMP, and gate recess (e.g., during steps 818 and 820).

Figure 20A:
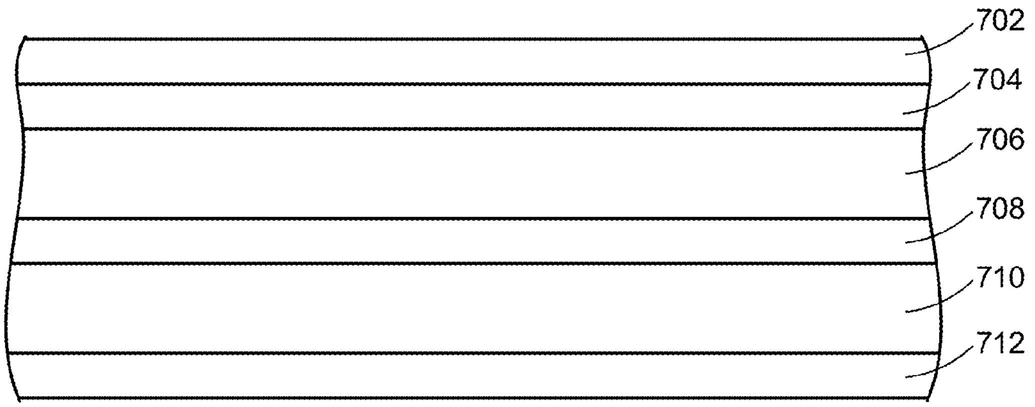
FIGS. 20A-20I depict various embodiments of processes for forming a dual gate structure for a vertical TFT.

FIG. 20A depicts a cross-sectional view of one embodiment after step 804 has been performed. As depicted, the one or more polysilicon layers comprise a first layer 712, a second layer 710 formed over the first layer 712, a third layer 708 formed over the second layer 710, a fourth layer 706 formed over the third layer 708, and a fifth layer 704 formed over the fourth layer 706. The first layer 712, the third layer 708, and the fifth layer 704 may comprise n-type polysilicon layers. The second layer 710 and the fourth layer 706 may comprise p-type polysilicon layers. A first hardmask 702 has been formed over the fifth layer 704.

Referring to FIGS. 19A-19B, in step 806, a plurality of oxide pillars is formed. The plurality of oxide pillars may be formed by etching a plurality of trenches extending through the one or more polysilicon layers and filling the plurality of trenches with an insulating material. The insulating material may comprise an oxide or silicon dioxide. The plurality of oxide pillars may be formed by patterning and then etching the first hardmask and the one or more polysilicon layers. The plurality of trenches may be filled using a high-density plasma (HDP) oxide gap fill. In some cases, after the plurality of trenches have been filled with the insulating material, an oxide CMP step may be performed to remove excess oxide. The first hardmask may act as a CMP stop layer for the oxide CMP. The first hardmask may comprise a nitride hardmask.

Figure 20B:
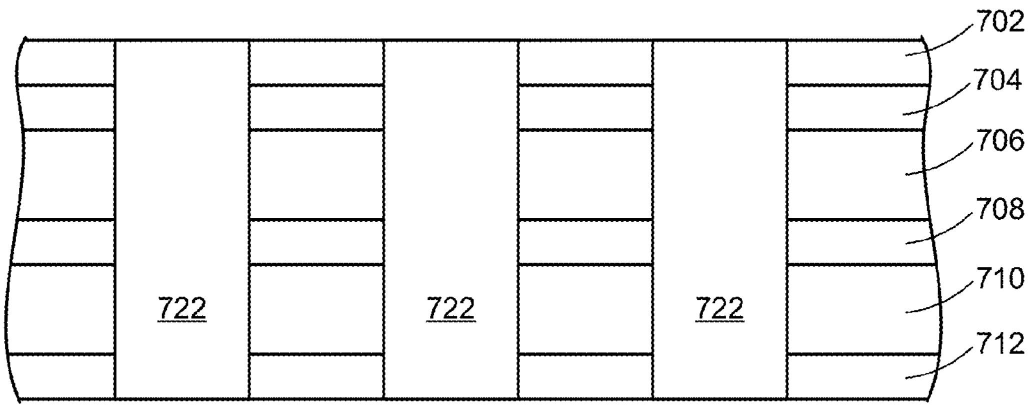

FIG. 20B depicts a cross-sectional view of one embodiment after step 806 has been performed. As depicted, a plurality of oxide pillars 722 have been formed extending through the one or more polysilicon layers 704, 706, 708, 710, and 712 and the first hardmask 702.

Referring to FIGS. 19A-19B, in step 808, a first etching process is performed. The first etching process may comprise a timed etch. The first etching process may be performed using various etching techniques such as dry etching, wet chemical etching, plasma etching, or reactive-ion etching (RIE). The first etching process may include etching a first set of oxide pillars of the plurality of oxide pillars to a first initial depth. The first set of oxide pillars may comprise every other oxide pillar of the plurality of oxide pillars. The first set of oxide pillars may comprise an even set of oxide pillars and the second set of oxide pillars may comprise an odd set of oxide pillars that are interdigitated with or are arranged in an alternating pattern with the first set of oxide pillars. The first set of oxide pillars may include a first oxide pillar in which a second oxide pillar that is next to the first oxide pillar is not part of the first set of oxide pillars. In some cases, a polysilicon layer stack may be formed between a first oxide pillar of the first set of oxide pillars and a second oxide pillar that is not part of the first set of oxide pillars.

Figure 20C:
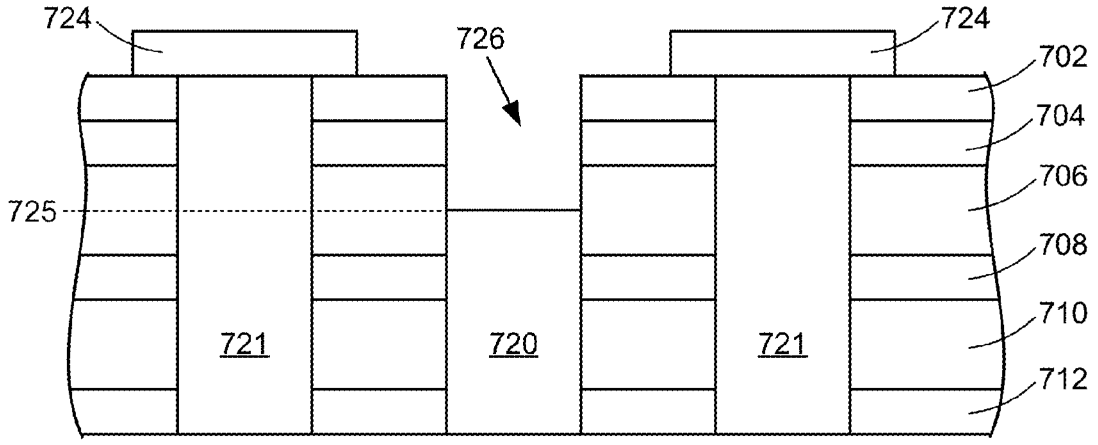

FIG. 20C depicts a cross-sectional view of one embodiment after step 808 has been performed. As depicted, the plurality of oxide pillars includes a first set of oxide pillars 720 and a second set of oxide pillars 721 different from the first set of oxide pillars 720. The first set of oxide pillars 720 have been etched to a first initial depth 725, thereby forming trench 726. Photoresist 724 may be used to selectively remove the insulating material from the first set of oxide pillars 720, while not removing the insulating material from the second set of oxide pillars 721. In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist. In one embodiment, multiple patterning lithography techniques (e.g., spacer-based double patterning) may be used to improve feature density.

Referring to FIGS. 19A-19B, in step 810, a second etching process is performed subsequent to performing the first etching process. The second etching process may comprise a timed etch. The second etching process may be performed using various etching techniques such as dry etching, wet chemical etching, plasma etching, or reactive-ion etching (RIE). The second etching process may form a first set of trenches by etching the first set of oxide pillars from the first initial depth to a first depth. The second etching process may form a second set of trenches by etching a second set of oxide pillars of the plurality of oxide pillars to a second depth higher than the first depth. In some cases, the formation of the first set of trenches and the formation of the second set of trenches may be performed during the same etching process. In one embodiment, the first depth and the second depth may both be lower than the first initial depth. In some cases, the distance between the first initial depth and the first depth may be substantially the same as the distance from the top of the one or more polysilicon layers to the second depth.

Figure 20D:
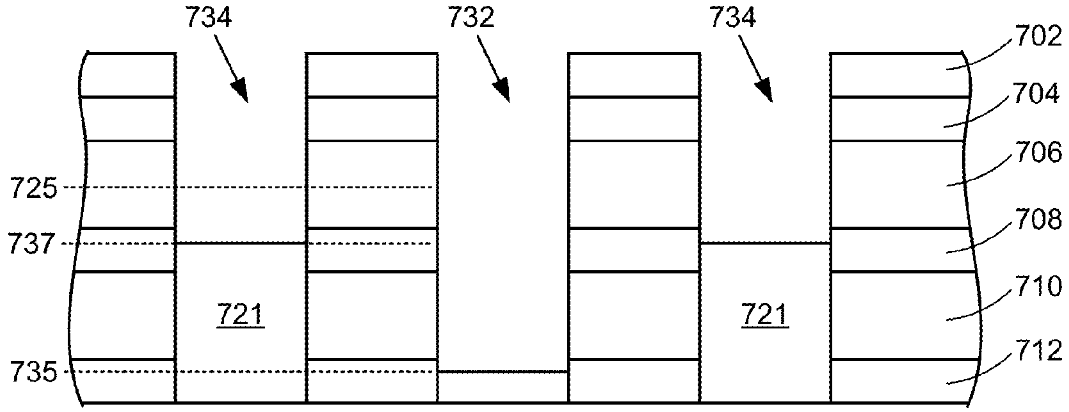

FIG. 20D depicts a cross-sectional view of one embodiment after step 810 has been performed. As depicted, the first set of oxide pillars 720 has been etched from the first initial depth 725 to a first depth 735, thereby forming a first set of trenches 732. The second set of oxide pillars 721 has been etched to a second depth 737 higher than the first depth 735, thereby forming a second set of trenches 734. The second depth 737 may be farther away from the bottom of the one or more polysilicon layers than the first depth 735. As depicted, the first depth 735 and the second depth 737 are both lower than the first initial depth 725.

Referring to FIGS. 19A-19B, in step 812, a plurality of gate dielectrics is formed within the first set of trenches and the second set of trenches. The plurality of gate dielectrics may be formed by depositing a gate dielectric material within the first set of trenches and the second set of trenches. The gate dielectric material may be deposited using atomic layer deposition techniques. The gate dielectric material may be conformally deposited within the first set of trenches and the second set of trenches and then etched using an anisotropic etch to form the plurality of gate dielectrics. The plurality of gate dielectrics may be formed along the sidewalls of the first set of trenches and the second set of trenches. The gate dielectric material may comprise a silicon oxide or high-k dielectric material. A first gate dielectric of the plurality of gate dielectrics may comprise a gate oxide or a gate dielectric of a vertical TFT.

Figure 20E:
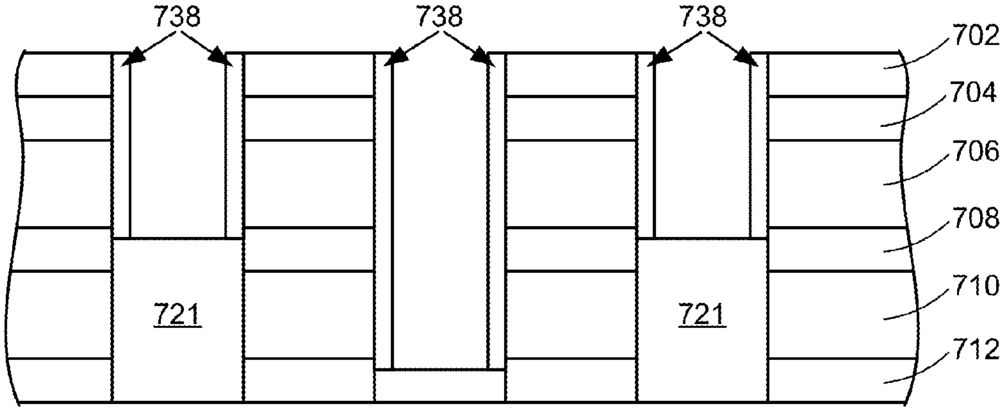

FIG. 20E depicts a cross-sectional view of one embodiment after step 812 has been performed. As depicted, a plurality of gate dielectrics 738 have been formed within the first set of trenches 732 and the second set of trenches 734.

Referring to FIGS. 19A-19B, in step 814, a first set of gate structures is formed. The first set of gate structures may be formed by filling the first set of trenches with a gate material subsequent to gate dielectrics being formed within the first set of trenches. In step 816, a second set of gate structures is formed. The second set of gate structures may be formed by filling the second set of trenches with the gate material subsequent to gate dielectrics being formed within the second set of trenches. In some cases, the formation of the first set of gate structures and the formation of the second set of gate structures may be performed during a common deposition process. The gate material may comprise polysilicon or TiN.

Figure 20F:
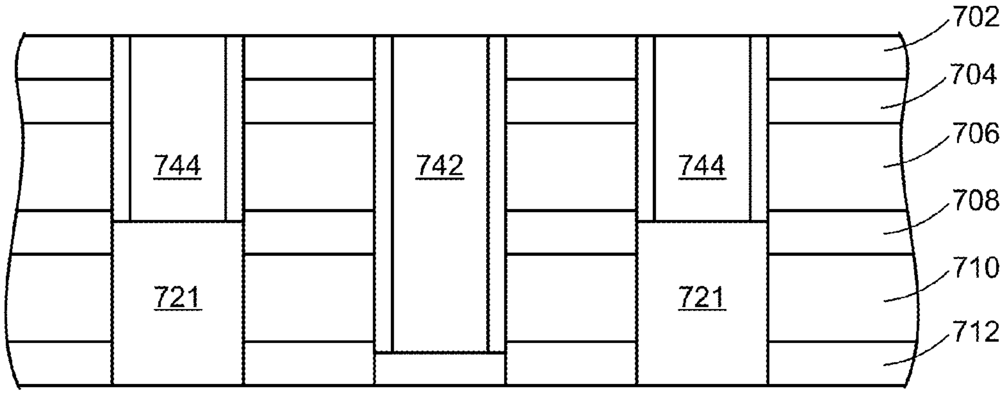

FIG. 20F depicts a cross-sectional view of one embodiment after steps 814 and 816 have been performed. As depicted, a first set of gate structures 742 have been formed within the first set of trenches 732. A second set of gate structures 744 have been formed within the second set of trenches 734.

Referring to FIGS. 19A-19B, in step 818, a third etching process is performed. The third etching process may comprise a timed etch. The third etching process may be performed using various etching techniques such as dry etching, wet chemical etching, plasma etching, or reactive-ion etching (RIE). The third etching process may include etching the first set of gate structures to a second initial depth. In one embodiment, the third etching process may remove the gate material while being highly selective to the gate dielectric material (i.e., without removing a threshold amount of the gate dielectric material). The third etching process may remove the gate material while being highly selective to oxide and/or nitride. In another embodiment, the third etching process may remove the gate material and the gate dielectric material.

Figure 20G:
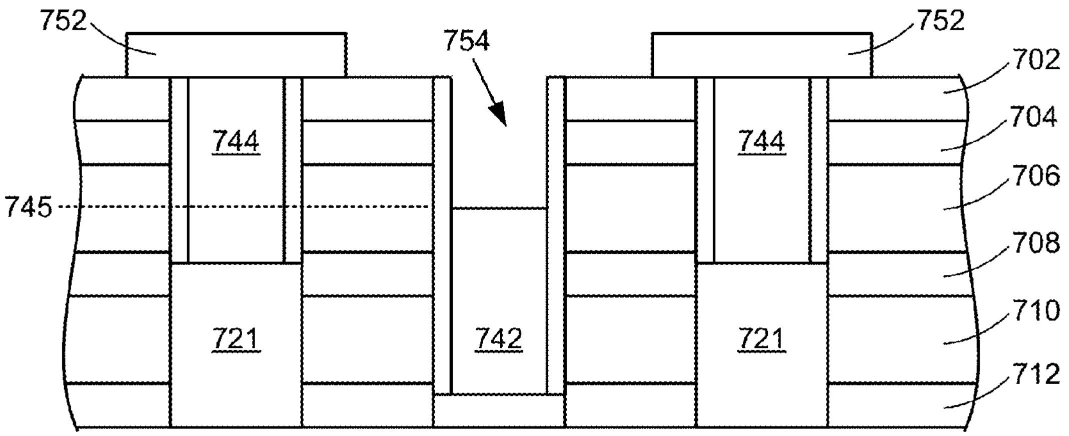

FIG. 20G depicts a cross-sectional view of one embodiment after step 818 has been performed. As depicted, the first set of gate structures 742 have been etched to a second initial depth 745, thereby forming trench 754. Photoresist 752 may be used to selectively remove the gate material from the first set of gate structures 742, while not removing the gate material from the second set of gate structures 744. In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist. In one embodiment, multiple patterning lithography techniques (e.g., spacer-based double patterning) may be used to improve feature density.

Referring to FIGS. 19A-19B, in step 820, a fourth etching process is performed subsequent to performing the third etching process. The fourth etching process may comprise a timed etch. The fourth etching process may be performed using various etching techniques such as dry etching, wet chemical etching, plasma etching, or reactive-ion etching (RIE). The fourth etching process may form a third set of trenches by etching the first set of gate structures from the second initial depth to a third depth. The fourth etching process may form a fourth set of trenches by etching the second set of gate structures to a fourth depth higher than the third depth. In some cases, the formation of the third set of trenches and the formation of the fourth set of trenches may be performed during the same etching process. In one embodiment, the third depth may be lower than the second initial depth and the fourth depth may be higher than the second initial depth. In some cases, the distance between the second initial depth and the third depth may be substantially the same as the distance from the top of the one or more polysilicon layers to the fourth depth. In one embodiment, the fourth etching process may remove the gate material while being highly selective to the gate dielectric material (i.e., without removing a threshold amount of the gate dielectric material). The fourth etching process may remove the gate material while being highly selective to oxide and/or nitride. In another embodiment, the fourth etching process may remove the gate material and the gate dielectric material.

Figure 20H:
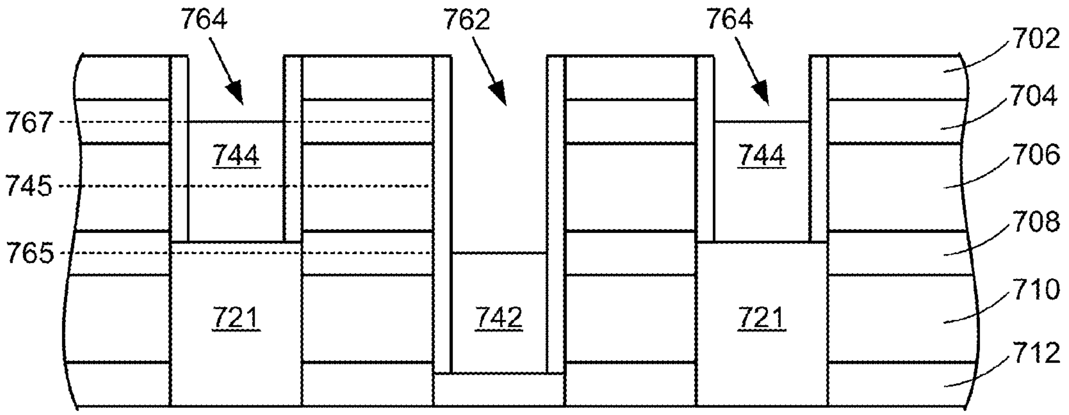

FIG. 20H depicts a cross-sectional view of one embodiment after step 820 has been performed. As depicted, the first set of gate structures 742 has been etched from the second initial depth 745 to a third depth 765, thereby forming a third set of trenches 762. The second set of gate structures 744 has been etched to a fourth depth 767 higher than the third depth 765, thereby forming a fourth set of trenches 764. The fourth depth 767 may be farther away from the bottom of the one or more polysilicon layers than the third depth 765. As depicted, the third depth 765 is lower than the second initial depth 745 and the fourth depth 767 is higher than the second initial depth 745.

Referring to FIGS. 19A-19B, in step 822, the third set of trenches and the fourth set of trenches are filled with the insulating material. The insulating material may comprise oxide or silicon dioxide. The third set of trenches and the fourth set of trenches may be filled using a high-density plasma (HDP) oxide gap fill. In some cases, after the third set of trenches and the fourth set of trenches have been filled with the insulating material, a CMP step may be performed to remove excess oxide and the first hardmask.

Figure 20I:
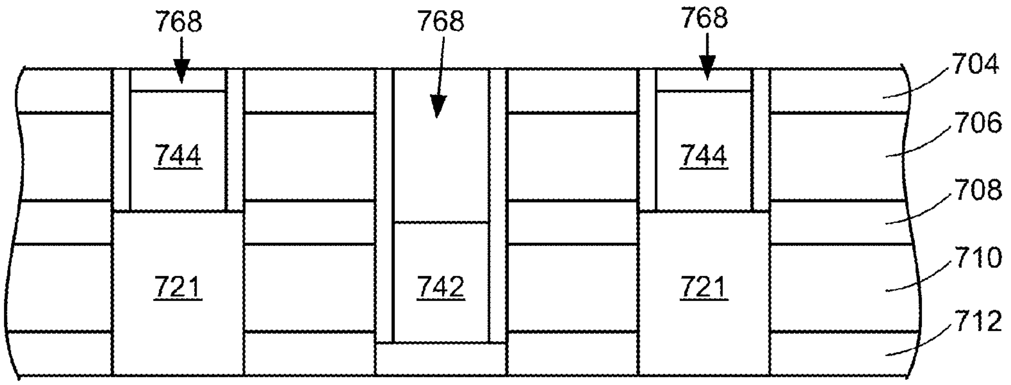

FIG. 20I depicts a cross-sectional view of one embodiment after step 822 has been performed. As depicted, the third set of trenches 762 and the fourth set of trenches 764 have been filled with insulating material 768. In some cases, after step 822 has been performed, the first hardmask 702 may be removed.

One embodiment of the disclosed technology includes performing a first etching process. The first etching process includes etching a first set of oxide pillars of a plurality of oxide pillars to a first initial depth. The plurality of oxide pillars includes a second set of oxide pillars different from the first set of oxide pillars. The method further comprises performing a second etching process subsequent to the performing the first etching process. The second etching process forms a first set of trenches by etching the first set of oxide pillars from the first initial depth to a first depth. The second etching process forms a second set of trenches by etching the second set of oxide pillars to a second depth higher than the first depth. The method further comprises forming a plurality of gate dielectrics within the first set of trenches and the second set of trenches and forming a first set of gate structures and a second set of gate structures. The forming the first set of gate structures and the second set of gate structures includes filling the first set of trenches and the second set of trenches with a gate material subsequent to the forming the plurality of gate dielectrics.

One embodiment of the disclosed technology includes forming one or more polysilicon layers and forming a plurality of oxide pillars. The forming a plurality of oxide pillars includes etching a plurality of trenches extending through the one or more polysilicon layers and filling the plurality of trenches with an insulating material. The plurality of oxide pillars includes a first set of oxide pillars and a second set of oxide pillars different from the first set of oxide pillars. The method further comprises forming a first set of trenches by etching the first set of oxide pillars to a first depth, forming a second set of trenches by etching the second set of oxide pillars to a second depth higher than the first depth, forming a plurality of gate dielectrics within the first set of trenches and the second set of trenches, and forming a first set of gate structures and a second set of gate structures. The forming the first set of gate structures and the second set of gate structures includes filling the first set of trenches and the second set of trenches with a gate material subsequent to the forming the plurality of gate dielectrics. The method further comprises forming a third set of trenches by etching the first set of gate structures to a third depth, forming a fourth set of trenches by etching the second set of gate structures to a fourth depth higher than the third depth, and filling the third set of trenches and the fourth set of trenches with the insulating material.

One embodiment of the disclosed technology includes forming one or more vertical TFTs. The forming one or more vertical TFTs includes performing a first etching process, the first etching process includes etching a first set of oxide pillars of a plurality of oxide pillars to a first initial depth, the plurality of oxide pillars includes a second set of oxide pillars different from the first set of oxide pillars. The forming one or more vertical TFTs includes performing a second etching process subsequent to the performing the first etching process. The second etching process forms a first set of trenches by etching the first set of oxide pillars from the first initial depth to a first depth. The second etching process forms a second set of trenches by etching the second set of oxide pillars to a second depth higher than the first depth, the first depth and the second depth are both lower than the first initial depth. The forming one or more vertical TFTs includes forming a plurality of gate dielectrics within the first set of trenches and the second set of trenches. The forming one or more vertical TFTs includes forming a first set of gate structures and a second set of gate structures. The forming the first set of gate structures and the second set of gate structures includes filling the first set of trenches and the second set of trenches with a gate material subsequent to the forming the plurality of gate dielectrics. The method further comprises forming a memory array above the one or more vertical TFTs. The memory array includes a first bit line. The one or more vertical TFTs include a first vertical TFT connected to the first bit line. The memory array may comprise a three-dimensional memory array.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for forming a dual gate structure for a vertical TFT, comprising:

forming one or more layers of polysilicon;

etching a plurality of trenches extending through the one or more layers of polysilicon;

forming a plurality of oxide pillars by filling the plurality of trenches with an insulating material;

performing a first etching process, the first etching process includes etching a first set of oxide pillars of the plurality of oxide pillars to a first initial depth, the plurality of oxide pillars includes a second set of oxide pillars different from the first set of oxide pillars;

performing a second etching process subsequent to the performing the first etching process, the second etching process forms a first set of trenches by etching the first set of oxide pillars from the first initial depth to a first depth and forms a second set of trenches by etching the second set of oxide pillars to a second depth higher than the first depth;

forming a plurality of gate dielectrics within the first set of trenches and the second set of trenches; and forming a first set of gate structures and a second set of gate structures, the forming the first set of gate structures and the second set of gate structures includes filling the first set of trenches and the second set of trenches with a gate material subsequent to the forming the plurality of gate dielectrics.

2. The method of claim 1, further comprising:

performing a third etching process, the third etching process includes etching the first set of gate structures to a second initial depth;

performing a fourth etching process subsequent to the performing the third etching process, the fourth etching process forms a third set of trenches by etching the first set of gate structures from the second initial depth to a third depth and forms a fourth set of trenches by etching the second set of gate structures to a fourth depth higher than the third depth; and filling the third set of trenches and the fourth set of trenches with the insulating material.

3. The method of claim 2, wherein:

the third depth is lower than the second initial depth, the fourth depth is higher than the second initial depth.

4. The method of claim 2, wherein:

the forming a plurality of gate dielectrics includes conformally depositing a gate dielectric material within the first set of trenches and the second set of trenches.

5. The method of claim 4, wherein:

the third etching process removes the gate material while being highly selective to the gate dielectric material.

6. The method of claim 4, wherein:

the gate material comprises at least one of titanium nitride or n+ polysilicon; and the gate dielectric material comprises at least one of silicon oxide or a high-k dielectric material.

7. The method of claim 1, wherein:

the first depth and the second depth are both lower than the first initial depth.

8. The method of claim 1, wherein:

the insulating material comprises silicon dioxide.

9. The method of claim 1, wherein:

the one or more layers of polysilicon include a first n-type polysilicon layer, a second p-type polysilicon layer formed over the first n-type polysilicon layer, a third n-type polysilicon layer formed over the second p-type polysilicon layer, a fourth p-type polysilicon layer formed over the third n-type polysilicon layer, and a fifth n-type polysilicon layer formed over the fourth p-type polysilicon layer.

10. The method of claim 9, wherein:

the second p-type polysilicon layer is associated with a first transistor channel of the vertical TFT and the fourth p-type polysilicon layer is associated with a second transistor channel of the vertical TFT, the vertical TFT may be placed into a conducting state when both the first transistor channel and the second transistor channel are inverted.

11. The method of claim 1 wherein:

the forming one or more layers of polysilicon includes forming the one or more layers of polysilicon above one or more global bit lines associated with a three-dimensional memory array.

12. The method of claim 1, wherein:

the first etching process comprises a first timed etch; and the second etching process comprises a second timed etch that is performed subsequent to the first timed etch, the second timed etch etches the first set of oxide pillars from the first initial depth to the first depth while the second set of oxide pillars is etched to the second depth higher than the first depth.

13. A method for forming a dual gate structure for a vertical TFT, comprising:

forming one or more polysilicon layers;

forming a plurality of oxide pillars, the forming a plurality of oxide pillars includes etching a plurality of trenches extending through the one or more polysilicon layers and filling the plurality of trenches with an insulating material, the plurality of oxide pillars includes a first set of oxide pillars and a second set of oxide pillars different from the first set of oxide pillars;

forming a first set of trenches by etching the first set of oxide pillars to a first depth at the same time as forming a second set of trenches by etching the second set of oxide pillars to a second depth higher than the first depth;

forming a plurality of gate dielectrics within the first set of trenches and the second set of trenches;

forming a first set of gate structures and a second set of gate structures, the forming the first set of gate structures and the second set of gate structures includes filling the first set of trenches and the second set of trenches with a gate material subsequent to the forming the plurality of gate dielectrics;

forming a third set of trenches by etching the first set of gate structures to a third depth;

forming a fourth set of trenches by etching the second set of gate structures to a fourth depth higher than the third depth; and filling the third set of trenches and the fourth set of trenches with the insulating material.

14. The method of claim 13, wherein:

the forming a plurality of gate dielectrics includes depositing a gate dielectric material within the first set of trenches and the second set of trenches.

15. The method of claim 14, wherein:

the third etching process removes the gate material while being highly selective to the gate dielectric material.

16. The method of claim 13, wherein:

the one or more polysilicon layers include a first n-type polysilicon layer, a second p-type polysilicon layer formed over the first n-type polysilicon layer, a third n-type polysilicon layer formed over the second p-type polysilicon layer, a fourth p-type polysilicon layer formed over the third n-type polysilicon layer, and a fifth n-type polysilicon layer formed over the fourth p-type polysilicon layer.

17. The method of claim 16, wherein:

the second p-type polysilicon layer is associated with a first transistor channel of the vertical TFT and the fourth p-type polysilicon layer is associated with a second transistor channel of the vertical TFT, the vertical TFT may be placed into a conducting state when both the first transistor channel and the second transistor channel are inverted.

18. The method of claim 13, wherein:

the forming one or more polysilicon layers includes forming the one or more polysilicon layers above one or more global bit lines associated with a three-dimensional memory array.

19. A method for manufacturing a semiconductor memory, comprising:

forming one or more vertical TFTs, the forming one or more vertical TFTs includes performing a first etching process, the first etching process includes etching a first set of oxide pillars of a plurality of oxide pillars to a first initial depth, the plurality of oxide pillars includes a second set of oxide pillars different from the first set of oxide pillars, the forming one or more vertical TFTs includes performing a second etching process subsequent to the performing the first etching process, the second etching process forms a first set of trenches by etching the first set of oxide pillars from the first initial depth to a first depth, the second etching process forms a second set of trenches by etching the second set of oxide pillars to a second depth higher than the first depth, the first depth and the second depth are both lower than the first initial depth, the forming one or more vertical TFTs includes forming a plurality of gate dielectrics within the first set of trenches and the second set of trenches, the forming one or more vertical TFTs includes forming a first set of gate structures and a second set of gate structures, the forming the first set of gate structures and the second set of gate structures includes filling the first set of trenches and the second set of trenches with a gate material subsequent to the forming the plurality of gate dielectrics; and forming a memory array above the one or more vertical TFTs, the memory array includes a first bit line, the one or more vertical TFTs include a first vertical TFT connected to the first bit line.

20. The method of claim 19, wherein:

the forming one or more vertical TFTs includes performing a third etching process, the third etching process includes etching the first set of gate structures to a second initial depth, the forming one or more vertical TFTs includes performing a fourth etching process subsequent to the performing the third etching process, the fourth etching process forms a third set of trenches by etching the first set of gate structures from the second initial depth to a third depth, the fourth etching process forms a fourth set of trenches by etching the second set of gate structures to a fourth depth higher than the third depth, the third depth is lower than the second initial depth, the fourth depth is higher than the second initial depth; and the memory array comprises a non-volatile memory that is monolithically formed in one or more physical levels of memory cells having active areas disposed above a silicon substrate.

* * * * *